US007868522B2

(12) United States Patent
Ruby

(10) Patent No.: US 7,868,522 B2
(45) Date of Patent: Jan. 11, 2011

(54) ADJUSTED FREQUENCY TEMPERATURE COEFFICIENT RESONATOR

(75) Inventor: Richard C. Ruby, Menlo Park, CA (US)

(73) Assignee: Avago Technologies Wireless IP (Singapore) Pte. Ltd., Singapore (SG)

(*) Notice: Subject to any disclaimer, the term of this patent is extended or adjusted under 35 U.S.C. 154(b) by 65 days.

(21) Appl. No.: 11/223,386

(22) Filed: Sep. 9, 2005

(65) Prior Publication Data

US 2007/0063622 A1 Mar. 22, 2007

(51) Int. Cl.
*H01L 41/04* (2006.01)
(52) U.S. Cl. .................... 310/346; 310/312; 310/320
(58) Field of Classification Search ............ 310/312, 310/324, 346, 320
See application file for complete search history.

(56) References Cited

U.S. PATENT DOCUMENTS

| 3,174,122 | A | 3/1965 | Fowler et al. |
| 3,189,851 | A | 6/1965 | Fowler |
| 3,321,648 | A | 5/1967 | Kolm |
| 3,422,371 | A | 1/1969 | Poirier et al. |
| 3,568,108 | A | 3/1971 | Poirier et al. |
| 3,582,839 | A | 6/1971 | Pim et al. |
| 3,590,287 | A | 6/1971 | Berlincourt et al. |
| 3,610,969 | A | 10/1971 | Clawson et al. |
| 3,826,931 | A | 7/1974 | Hammond |
| 3,845,402 | A | 10/1974 | Nupp |
| 4,084,217 | A | 4/1978 | Brandis et al. |
| 4,172,277 | A | 10/1979 | Pinson |
| 4,272,742 | A | 6/1981 | Lewis |
| 4,281,299 | A | 7/1981 | Newbold |
| 4,320,365 | A | 3/1982 | Black et al. |
| 4,355,408 | A | 10/1982 | Scarrott |
| 4,456,850 | A | 6/1984 | Inoue et al. |
| 4,529,904 | A | 7/1985 | Hattersley |
| 4,608,541 | A | 8/1986 | Moriwaki et al. |
| 4,625,138 | A | 11/1986 | Ballato |
| 4,640,756 | A | 2/1987 | Wang et al. |
| 4,719,383 | A | 1/1988 | Wang et al. |
| 4,798,990 | A | 1/1989 | Henoch |
| 4,819,215 | A | 4/1989 | Yokoyama et al. |
| 4,836,882 | A * | 6/1989 | Ballato .................... 216/59 |

(Continued)

FOREIGN PATENT DOCUMENTS

DE 10160617 6/2003

(Continued)

OTHER PUBLICATIONS

Search Report for Great Britain Patent Application No. 0617742.2 dated Dec. 13, 2006.

(Continued)

*Primary Examiner*—Walter Benson
*Assistant Examiner*—Derek J Rosenau

(57) ABSTRACT

A temperature compensated pair of resonators. The temperature compensated pair of resonators comprises a first resonator configured to resonate at a first frequency and having a first frequency temperature coefficient and a second resonator configured to resonate at a second frequency and having a second frequency temperature coefficient. The second frequency is greater than the first frequency; the second frequency temperature coefficient is less than the first frequency temperature coefficient; and the first and the second resonators are fabricated on a common substrate.

12 Claims, 13 Drawing Sheets

U.S. PATENT DOCUMENTS

| | | | |
|---|---|---|---|
| 4,841,429 A | 6/1989 | Mcclanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,587,620 A | 12/1996 | Ruby et al. |
| 5,589,858 A | 12/1996 | Kadowaki et al. |
| 5,594,705 A | 1/1997 | Connor et al. |
| 5,633,574 A | 5/1997 | Sage |
| 5,671,242 A | 9/1997 | Takiguchi et al. |
| 5,692,279 A | 12/1997 | Mang et al. |
| 5,705,877 A | 1/1998 | Shimada |
| 5,714,917 A | 2/1998 | Ella |
| 5,789,845 A | 8/1998 | Wadaka et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,060,818 A | 5/2000 | Ruby et al. |
| 6,087,198 A | 7/2000 | Panasik |
| 6,107,721 A | 8/2000 | Lakin |
| 6,111,341 A | 8/2000 | Hirama |
| 6,111,480 A | 8/2000 | Iyama et al. |
| 6,124,678 A | 9/2000 | Bishop et al. |
| 6,124,756 A | 9/2000 | Yaklin et al. |
| 6,131,256 A | 10/2000 | Dydyk et al. |
| 6,150,703 A | 11/2000 | Cushman et al. |
| 6,187,513 B1 | 2/2001 | Katakura |
| 6,215,375 B1 | 4/2001 | Larson, III et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 * | 11/2002 | Larson et al. ............... 310/348 |
| 6,486,751 B1 | 11/2002 | Barber et al. |
| 6,489,688 B1 | 12/2002 | Baumann et al. |
| 6,492,883 B2 | 12/2002 | Liang et al. |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,550,664 B2 | 4/2003 | Bradley et al. |
| 6,559,487 B1 | 5/2003 | Kang et al. |
| 6,564,448 B1 | 5/2003 | Oura et al. |
| 6,566,956 B2 | 5/2003 | Ohnishi et al. |
| 6,566,979 B2 | 5/2003 | Larson et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,617,249 B2 | 9/2003 | Ruby et al. |
| 6,617,750 B2 | 9/2003 | Dummermuth et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 6,738,267 B1 | 5/2004 | Navas Sabater et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,842,089 B2 | 1/2005 | Lee |

| | | | | | | |
|---|---|---|---|---|---|---|
| 6,873,065 B2 | 3/2005 | Haigh et al. | | 2004/0092234 A1 | 5/2004 | Pohjonen |
| 6,873,529 B2 | 3/2005 | Ikuta et al. | | 2004/0113720 A1* | 6/2004 | Komuro et al. ............. 333/133 |
| 6,874,211 B2 | 4/2005 | Bradley et al. | | 2004/0124952 A1 | 7/2004 | Tikka |
| 6,874,212 B2 | 4/2005 | Larson, III | | 2004/0150293 A1 | 8/2004 | Unterberger |
| 6,888,424 B2 | 5/2005 | Takeuchi et al. | | 2004/0150296 A1 | 8/2004 | Park et al. |
| 6,900,705 B2 | 5/2005 | Nakamura et al. | | 2004/0195937 A1 | 10/2004 | Matsubara et al. |
| 6,903,452 B2 | 6/2005 | Ma et al. | | 2004/0212458 A1 | 10/2004 | Lee |
| 6,906,451 B2 | 6/2005 | Yamada et al. | | 2004/0257171 A1 | 12/2004 | Park et al. |
| 6,911,708 B2 | 6/2005 | Park | | 2004/0257172 A1 | 12/2004 | Schmidhammer et al. |
| 6,917,261 B2 | 7/2005 | Unterberger | | 2004/0263287 A1 | 12/2004 | Ginsburg et al. |
| 6,924,583 B2 | 8/2005 | Lin et al. | | 2005/0012570 A1 | 1/2005 | Korden et al. |
| 6,924,717 B2 | 8/2005 | Ginsburg et al. | | 2005/0023931 A1 | 2/2005 | Bouche et al. |
| 6,927,651 B2 | 8/2005 | Larson, III et al. | | 2005/0030126 A1 | 2/2005 | Inoue et al. |
| 6,936,928 B2 | 8/2005 | Hedler et al. | | 2005/0036604 A1 | 2/2005 | Scott et al. |
| 6,936,954 B2 | 8/2005 | Peczalski | | 2005/0057117 A1 | 3/2005 | Nakatsuka et al. |
| 6,943,648 B2 | 9/2005 | Maiz et al. | | 2005/0057324 A1 | 3/2005 | Onishi et al. |
| 6,946,928 B2 | 9/2005 | Larson et al. | | 2005/0068124 A1 | 3/2005 | Stoemmer |
| 6,954,121 B2 | 10/2005 | Bradley et al. | | 2005/0093396 A1* | 5/2005 | Larson et al. ............... 310/320 |
| 6,963,257 B2 | 11/2005 | Ella et al. | | 2005/0093653 A1 | 5/2005 | Larson, III |
| 6,970,365 B2* | 11/2005 | Turchi .................. 363/81 | | 2005/0093654 A1 | 5/2005 | Larson et al. |
| 6,975,183 B2 | 12/2005 | Aigner et al. | | 2005/0093655 A1 | 5/2005 | Larson et al. |
| 6,977,563 B2 | 12/2005 | Komuro et al. | | 2005/0093657 A1 | 5/2005 | Larson et al. |
| 6,985,052 B2 | 1/2006 | Tikka | | 2005/0093658 A1 | 5/2005 | Larson et al. |
| 6,987,433 B2 | 1/2006 | Larson et al. | | 2005/0093659 A1 | 5/2005 | Larson et al. |
| 6,989,723 B2 | 1/2006 | Komuro et al. | | 2005/0104690 A1 | 5/2005 | Larson |
| 6,998,940 B2 | 2/2006 | Metzger | | 2005/0110598 A1 | 5/2005 | Larson, III |
| 7,019,604 B2 | 3/2006 | Gotoh et al. | | 2005/0128030 A1 | 6/2005 | Larson et al. |
| 7,019,605 B2 | 3/2006 | Larson | | 2005/0140466 A1 | 6/2005 | Larson, III et al. |
| 7,026,876 B1 | 4/2006 | Esfandiari et al. | | 2005/0167795 A1 | 8/2005 | Higashi |
| 7,057,476 B2 | 6/2006 | Hwu | | 2005/0193507 A1 | 9/2005 | Ludwiczak |
| 7,064,606 B2 | 6/2006 | Louis | | 2005/0206271 A1 | 9/2005 | Higuchi et al. |
| 7,084,553 B2 | 8/2006 | Ludwiczak | | 2005/0218488 A1 | 10/2005 | Matsuo |
| 7,091,649 B2 | 8/2006 | Larson | | 2006/0087199 A1 | 4/2006 | Larson et al. |
| 7,098,758 B2 | 8/2006 | Wang et al. | | 2006/0103492 A1 | 5/2006 | Feng et al. |
| 7,128,941 B2 | 10/2006 | Lee | | 2006/0125489 A1 | 6/2006 | Feucht et al. |
| 7,161,448 B2 | 1/2007 | Feng et al. | | 2006/0132262 A1 | 6/2006 | Fazzlo et al. |
| 7,170,215 B2 | 1/2007 | Namba et al. | | 2006/0164183 A1 | 7/2006 | Tikka et al. |
| 7,173,504 B2 | 2/2007 | Larson | | 2006/0185139 A1 | 8/2006 | Larson, III et al. |
| 7,187,254 B2 | 3/2007 | Su et al. | | 2006/0197411 A1 | 9/2006 | Hoen et al. |
| 7,209,374 B2 | 4/2007 | Noro | | 2006/0238070 A1 | 10/2006 | Costa et al. |
| 7,230,509 B2 | 6/2007 | Stoemmer | | 2007/0084964 A1 | 4/2007 | Sternberger |
| 7,230,511 B2 | 6/2007 | Onishi et al. | | 2007/0085447 A1 | 4/2007 | Larson |
| 7,259,498 B2* | 8/2007 | Nakatsuka et al. .......... 310/324 | | 2007/0085631 A1 | 4/2007 | Larson et al. |
| 7,281,304 B2 | 10/2007 | Kim et al. | | 2007/0085632 A1 | 4/2007 | Larson et al. |
| 7,310,861 B2 | 12/2007 | Aigner et al. | | 2007/0086080 A1 | 4/2007 | Larson et al. |
| 7,332,985 B2 | 2/2008 | Laqrson et al. | | 2007/0086274 A1 | 4/2007 | Nishimura et al. |
| 7,367,095 B2 | 5/2008 | Larson, III et al. | | 2007/0090892 A1 | 4/2007 | Larson |
| 7,369,013 B2 | 5/2008 | Fazzio et al. | | 2007/0170815 A1 | 7/2007 | Unkrich |
| 7,388,318 B2 | 6/2008 | Yamada et al. | | 2007/0171002 A1 | 7/2007 | Unkrich |
| 7,388,455 B2 | 6/2008 | Larson, III | | | | |
| 7,408,428 B2 | 8/2008 | Larson, III | | FOREIGN PATENT DOCUMENTS | | |
| 7,414,349 B2 | 8/2008 | Sasaki | | EP | 0231892 | 8/1987 |
| 7,425,787 B2 | 9/2008 | Larson, III | | EP | 0637875 | 2/1995 |
| 7,439,824 B2 | 10/2008 | Aigner | | EP | 0689254 | 6/1995 |
| 2001/0054941 A1 | 12/2001 | Shibata et al. | | EP | 0865157 | 9/1998 |
| 2002/0000646 A1 | 1/2002 | Gooch et al. | | EP | 0880227 | 11/1998 |
| 2002/0030424 A1 | 3/2002 | Iwata | | EP | 0973256 | 1/2000 |
| 2002/0063497 A1* | 5/2002 | Panasik ..................... 310/364 | | EP | 1047189 | 10/2000 |
| 2002/0121944 A1 | 9/2002 | Larson, III et al. | | EP | 1100196 | 11/2000 |
| 2002/0121945 A1 | 9/2002 | Ruby et al. | | EP | 1096259 | 5/2001 |
| 2002/0152803 A1 | 10/2002 | Larson, III et al. | | EP | 1100196 | 5/2001 |
| 2002/0190814 A1 | 12/2002 | Yamada et al. | | EP | 1258990 | 11/2002 |
| 2003/0001251 A1 | 1/2003 | Cheever et al. | | EP | 1180494 | 3/2003 |
| 2003/0006502 A1 | 1/2003 | Karpman | | EP | 1542362 | 6/2003 |
| 2003/0051550 A1 | 3/2003 | Nguyen et al. | | EP | 1258989 | 1/2004 |
| 2003/0087469 A1 | 5/2003 | Ma | | EP | 1528674 | 6/2004 |
| 2003/0102776 A1 | 6/2003 | Takeda et al. | | EP | 1528675 | 6/2004 |
| 2003/0111439 A1 | 6/2003 | Fetter et al. | | EP | 1528677 | 7/2004 |
| 2003/0128081 A1 | 7/2003 | Ella et al. | | EP | 1249932 | 3/2005 |
| 2003/0132493 A1 | 7/2003 | Kang et al. | | EP | 1517443 | 3/2005 |
| 2003/0141946 A1 | 7/2003 | Ruby et al. | | EP | 1517444 | 3/2005 |
| 2003/0179053 A1 | 9/2003 | Aigner et al. | | EP | 1528676 | 5/2005 |
| 2004/0016995 A1 | 1/2004 | Kuo et al. | | | | |

| | | |
|---|---|---|
| EP | 1557945 | 7/2005 |
| EP | 1575165 | 9/2005 |
| GB | 1207974 | 11/1967 |
| GB | 2013343 | 8/1979 |
| GB | 2411239 | 8/2005 |
| GB | 2418791 | 4/2006 |
| GB | 2427773 | 1/2007 |
| JP | 59-160308 | 9/1984 |
| JP | 60-16010 | 1/1985 |
| JP | 61054686 | 3/1986 |
| JP | 61-57108 | 6/1994 |
| JP | 2001-203558 | 7/2001 |
| JP | 2002/217676 | 8/2002 |
| WO | WO-98/16957 | 4/1998 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO 2005/043756 | 5/2005 |
| WO | WO-2003/018788 | 2/2006 |

OTHER PUBLICATIONS

Search Report for Great Britain Patent Application No. 0617742.2 dated Mar. 29, 2007.
U.S. Appl. No. 10/971,169, filed Oct. 22, 2004, Larson, III, John D., et al.
Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.
Reinhardt, Alexandre et al., "Design of Coupled Resonator Filters Using Admittance and Scattering Matrices", *2003 IEEE Ultrasonics Symposium*, (May 3, 2003),1428-1431.
Jiang, Yimin et al., "A Novel Single-Phase Power Factor Correction Scheme", *IEEE*, (1993),287-292.
Lakin, K.M. "Coupled Resonator Filters", *2002 IEEE Ultrasonics Symposium*, (Mar. 2, 2002),901-908.
Lakin, K.M. et al., "High Performance Stacked Crystal Filters for GPS and Wide Bandwidth Applications", *2001 IEEE Ultrasonics Symposium*, (Jan. 1, 2001),833-838.
Krishnaswamy, S.V. et al., "Film Bulk Acoustic Wave Resonator Technology", (May 29, 1990),529-536.
Lobl, H.P. et al., "Piezoelectric Materials for BAW Resonators and Filters", *2001 IEEE Ultrasonics Symposium*, (Jan. 1, 2001),807-811.
Lakin, K.M. "Bulk Acoustic Wave Coupled Resonator Filters", *2002 IEEE International Frequency Control Symposium and PDA Exhibition*, (Jan. 2, 2002),8-14.
Jung, Jun-Phil et al., "Experimental and Theoretical Investigation on the Relationship Between AlN Properties and AlN-Based FBAR Characteristics", *2003 IEEE International Frequency Control Symposium and PDA Exhibition Jointly with the 17th European Frequency and Time Forum*, (Sep. 3, 2003),779-784.
Yang, C.M. et al., "Highly C Axis Oriented AlN Film Using MOCVD for 5GHx Band FBAR Filter", *2003 IEEE Ultrasonics Symposium*, (Oct. 5, 2003),pp. 170-173.
Martin, Steven J., et al., "Development of a Low Dielectric Constant Polymer for the Fabrication of Integrated Circuit Interconnect", *12 Advanced Materials*, (Dec. 23, 2000),1769-1778.
Hadimioglu, B. et al., ""Polymer Films as Acoustic Matching Layers".", *1990 IEEE Ultrasonics Symposium Proceedings*, vol. 3 PP., [Previously submitted as "Polymer Files as Acoustic Matching Layers, 1990 IEEE Ultrasonics Symposium Proceeding. vol. 4 pp. 1227-1340, Dec. 1990". Considered by Examiner on Mar. 20, 2007,(Dec. 1990),1337-1340.

"Search Report from corresponding application No.", GB 0605779.8, (Aug. 23, 2006).
"Examination Report from UK for application", GB 0605971.1, (Aug. 24, 2006).
"Examination report corresponding to application No.", GB0605770.7, (Aug. 25, 2006).
"Examination Report corresponding to application No.", GB0605775.6, (Aug. 30, 2006).
"Search report from corresponding application No.", GB0620152.9, (Nov. 15, 2006).
"Search report from corresponding application No.", GB0620655.1, (Nov. 17, 2006).
"Search report from corresponding application No.", GB0620653.6, (Nov. 17, 2006).
"Search Report from corresponding application No.", GB0620657.7, (Nov. 23, 2006).
Coombs, Clyde F., et al., "Electronic Instrument Handbook", Second Edition, McGraw-Hill, Inc., (1995),pp. 5.1 to 5.29.
"A Partial GB Search Report for", Application No. GB0522393.8, (Jan. 9, 2006),4 pages.
"A Partial GB Search Report for Application No.", GB0525884.3, (Feb. 2, 2006),4 pgs.
Auld, B. A., "Acoustic Resonators", *Acoustic Fields and Waves in Solids*, Second Edition, vol. II, (1990),250-259.
"British Search Report Application No.", 0605222.9, (Jul. 11, 2006).
Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.* 54 (10), (Oct. 1983),5893-5910.
"Search Report from corresponding application", No. GB0605225.2, Jun. 26, 2006.
"Search Report in the Great Britian Patent Application", No. 0619698.4, (Nov. 30, 2006).
Ruby, R. et al., "The Effect of Perimeter Geometry on FBAR Resonator Electrical Performance", *Microwave Symposium Digest, 2005 IEEE MTT-S International*, (Jun. 12, 2005),217-221.
Schuessler, Hans H., "Ceramic Filters and Resonators", *Reprinted from IEEE Trans. Sonics Ultrason.*, vol. SU-21, (Oct. 1974),257-268.
Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004),927-929.
Choi, Sungjin et al., "Design of Half-Bridge Piezo-Transformer Converters in the AC Adapter Applications", *IEEE 2005*, 244-248.
Li, Yunxiu et al., "AC-DC Converter with Worldwide Range Input Voltage by Series and Parallel Piezoelectric Transformer Connection", *35th Annual IEEE Power Electronics Specialists Conference*, (2004).
Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).
Navas, J. et al., "Miniaturised Battery Charger using Piezoelectric Transformers", *IEEE*, (2001),492-496.
Ruby, R. C., "Micro-Machined Thin Film Bulk Acoustic Resonators", *Proc. IEEE 48th, Symposium on Frequency control*, (1994),135-138.
Larson III, J. D., et al., "Measurement of Effective Kt2q,RpRs vs. Temperature for Mo/AlN/Mo Resonators", *2002 IEEE Ultrasonics Symposium*, Munich, Germany, (Oct. 2002),915-919.
Aoyama, T. et al., "Diffusion of Boron, Phosphorous, Arsenic and Antimony in Thermally Grown SiliconDioxide", *Fiujitsu Labs, J. Electromechanical Soc.*, vol. 146, No. 5, (1999),1879-1883.
Parker, T. E., et al., "Temperature-Compensated Surface Acoustic-Wave Devices with SiO2 Film Overlays", *J. Appl. Physics*, vol. 50, (1360-1369),Mar. 1979.
Tsubbouchi, K. et al., "Zero Temperature coefficient Surface Acoustic Wave Devices using Epitaxial AlN Films", *IEEE Ultrasonic symposium*, San Diaego, CA, 1082, (1982),240-245.
Lakin, K. M., "Thin Film Resonators and Filters", *IEEE Untrasonics Symposium*, Caesar's Tahoe, NV, (Oct. 1999),895-906.
Lakin, K. M., et al., "Temperature Compensated Bulk Acoustic Thin Film Resonators", *IEEE Ultrasonics Symposium*, San Juan, Puerto Rico, (Oct. 2000),855-858.

Ohta, S. et al., "Temperature Characteristics of Solidly Mounted Piezoelectric Thin Film Resonators", *IEEE Ultrasonics Symposium*, Honolulu, HI, (Oct. 2003),2011-2015.

Bauer, L. O., et al., "Properties of Silicon Implanted with Boron Ions through Thermal Silicon Dioxide", *Solid State Electronics*, vol. 16, No. 3,(Mar. 1973),289-300.

Topich, J. A., et al., "Effects of Ion Implanted Flourine in Silicon Dioxide", *Nuclear Instr. and Methods, Cecon Rec*, Cleveland, OH, (May 1978),70-73.

Hara, K. "Surface Treatment of Quartz Oscillator Plate by Ion Implantation", *Oyo Buturi*, vol. 47, No. 2, (Feb. 1978),145-146.

Ng, J. et al., "The Diffusion Ion-Implanted Boron in Silicon Dioxide", *AIP Conf. Proceedings*, No. 122, (1984),20-33.

Sanchez, A.M. et al., "Mixed analytical and numerical design method for piezoelectric transformers", IEEE,PESX, (Jun. 2003),841-846.

Pang, W. et al., "High Q Single-Mode High-Tone Bulk Acoustic Resonator Integrated With Surface-Machined FBAR Filter", *Microwave Symposium Digest, IEEE MTT-S International*, (2005),413-416.

Vasic, D et al., "A new MOSFET & IGBT Gate Drive Insulated by a Piezoelectric Transformer", *IEEE 32 nd Annual Power Electronics SPecialists Conference*, 2001 vol. 3, (Jun. 17-21, 2003),1479-1484.

Vasic, D et al., "A New Method to Design Piezoelectric Transformer Uned to MOSFET & IGBT Drive Circuits", *IEEE 34th ANuual Power Electronics Specialists Conference*, 2003 vol. 1, (Jun. 15-19, 2003),307-312.

* cited by examiner

US 7,868,522 B2

ADJUSTED FREQUENCY TEMPERATURE COEFFICIENT RESONATOR

REFERENCE TO RELATED U.S. PATENTS

The subject matter of the instant Application is related to that of the following U.S. patents: (1) U.S. Pat. No. 5,587,620 by Ruby et al., entitled "Tunable Thin Film Acoustic Resonators and Method for Making the Same", issued 24 Dec. 1996, and assigned to Agilent Technologies, Inc., (2) U.S. Pat. No. 5,873,153 by Ruby et al., entitled "Method of Making Tunable Thin Film Acoustic Resonators", issued 23 Feb. 1999, and assigned to Agilent Technologies, Inc., and (3) U.S. Pat. No. 6,060,818 by Ruby et al., entitled "SBAR Structures and Method of Fabrication of SBAR.FBAR Film Processing Techniques for the Manufacturing of SBAR/BAR Filters", issued 9 May 2000, and assigned to Agilent Technologies, Inc. These patents describe basic techniques for fabricating tunable thin film acoustic resonators, which techniques include components of the representative embodiments described below. Accordingly, each of the above-referenced U.S. patents is incorporated by reference in its entirety herein.

BACKGROUND

Numerous modern electronic devices from the simple wrist watch to the more sophisticated computer servers depend upon the generation of one or more clock or oscillator signals. To meet the needs of various applications, the signals generated must be accurate and stable. In addition, the operational frequencies of the generated signals must not significantly deviate with changes in temperature from the design frequency.

Essentially all cell phones, computers, microwave ovens, and numerous other electronic products use a quartz crystal resonator to generate a reference signal at a pre-selected frequency which is typically around 20 MHz. Such oscillators are referred to as crystal-controlled oscillators. The gates in these products are "clocked" or switched at the pre-selected frequency using the reference signal. Any and all "time references" are generated from this quartz resonator-oscillator. In cell phones, laptop computers, and other portable devices, the quartz resonator-circuit is larger than desirable. Typically, the oscillator needs to have an approximate +/−2 ppm frequency drift over the product's full operational temperature range. To achieve this level of frequency control the quartz resonator is usually found packaged in a hermetic ceramic package with a metal lid that is arc-welded around the perimeter. As such, the package is relatively expensive. An example is the Kyocera TCXO part number KT21. This product is provided in a ceramic package that is 3.2×2.5×1 mm$^3$, has +/−2 ppm accuracy from −30° to 85° C., and draws 2 mA of current. As this crystal's resonant frequency is 20 MHz, the signal from an oscillator using this product must be multiplied upwards by other power consuming electronics. Further, the resultant harmonics are generally only suppressed by approximately 5 dB relative to the fundamental frequency.

Oscillators can also be constructed using other types of resonators, for example standard L-C (inductor-capacitive) resonators, thin film bulk acoustic resonators (FBARS), and the like. While such resonators are less expensive than quartz resonators their frequency drift characteristics are generally less than acceptable for the applications mentioned above.

SUMMARY

In representative embodiments, a temperature compensated pair of resonators is disclosed. The temperature compensated pair of resonators comprises a first resonator and a second resonator. The first resonator is configured to resonate at a first frequency and has a first frequency temperature coefficient. The second resonator is configured to resonate at a second frequency and has a second frequency temperature coefficient. The second frequency is greater than the first frequency; the second frequency temperature coefficient is less than the first frequency temperature coefficient; and the first and second resonators are fabricated on a common substrate.

In another representative embodiment, a method for fabricating a first resonator and a second resonator on a substrate is disclosed. The method comprises creating a first bottom electrode and a second bottom electrode, creating a first bottom piezoelectric layer and a second bottom piezoelectric layer, creating an interstitial layer, creating a first top piezoelectric layer and a second top piezoelectric layer, and creating a first top electrode and a second top electrode. The first bottom electrode and the second bottom electrode partially overlay the substrate; the first bottom piezoelectric layer at least partially overlays the first bottom electrode; the second bottom piezoelectric layer at least partially overlays the second bottom electrode; the interstitial layer at least partially overlays the first bottom piezoelectric layer; the first top piezoelectric layer at least partially overlays the interstitial layer; the second top piezoelectric layer at least partially overlays the second bottom piezoelectric layer; the first top electrode is located over at least part of the first top piezoelectric layer; and the second top electrode at least partially overlays the second top piezoelectric layer.

In yet another representative embodiment, a method for fabricating a first resonator and a second resonator on a substrate is disclosed. The method comprises creating a first bottom electrode partially overlaying the substrate and a second bottom electrode partially overlaying the substrate, creating a first piezoelectric layer and a second piezoelectric layer, creating a first top electrode and a second top electrode, and creating a mass load layer. The first piezoelectric layer at least partially overlays the first bottom electrode; the second piezoelectric layer at least partially overlays the second bottom electrode; the second top electrode at least partially overlays the second piezoelectric layer; and the temperature coefficient of the stiffness of the mass load layer differs from that of the second top electrode. Either the first top electrode at least partially overlays the first piezoelectric layer and the mass load layer at least partially overlays the first top electrode or the mass load layer at least partially overlays the first piezoelectric layer and the first top electrode at least partially overlays the mass load layer.

In still another representative embodiment, a method for fabricating a first resonator and a second resonator on a substrate is disclosed. The method comprises creating a bottom mass load layer, creating a first bottom electrode and a second bottom electrode, creating a first piezoelectric layer and a second piezoelectric layer, and creating a first top electrode and a second top electrode. The second bottom electrode partially overlays the substrate; the temperature coefficient of the stiffness of the bottom mass load layer differs from that of the second bottom electrode; and the second piezoelectric layer at least partially overlays the second bottom electrode. Either the bottom mass load layer partially overlays the substrate, the first bottom electrode at least partially overlays the bottom mass load layer, and the first piezoelectric layer at least partially overlays the first bottom electrode or the first bottom electrode partially overlays the substrate, the bottom mass load layer at least partially overlays the first bottom electrode, and the first piezoelectric layer at least partially overlays the bottom mass load layer. The first top electrode is located over the first piezoelectric layer, and the second top electrode at least partially overlays the second piezoelectric layer.

Other aspects and advantages of the representative embodiments presented herein will become apparent from the following detailed description, taken in conjunction with the accompanying drawings.

BRIEF DESCRIPTION OF THE DRAWINGS

The accompanying drawings provide visual representations which will be used to more fully describe various representative embodiments and can be used by those skilled in the art to better understand them and their inherent advantages. In these drawings, like reference numerals identify corresponding elements.

DETAILED DESCRIPTION

Figure 1:
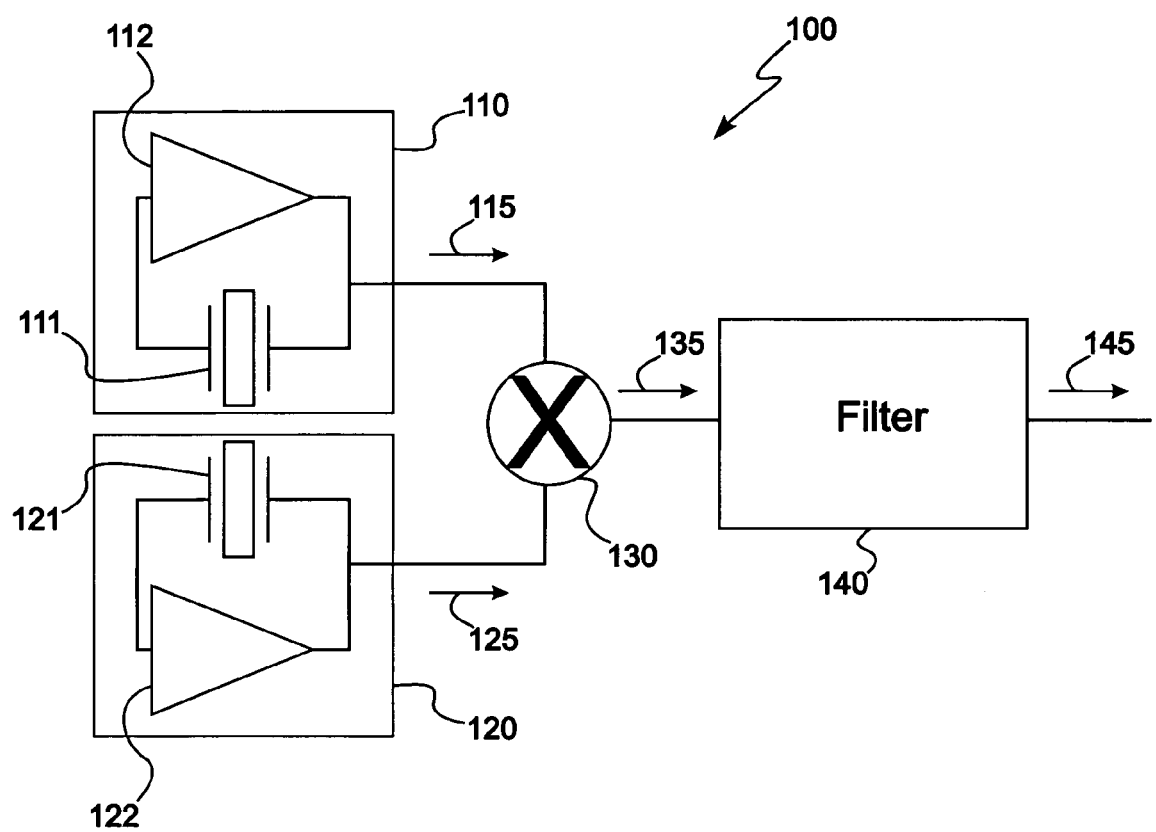
FIG. 1 is a drawing of a block diagram of an oscillatory circuit as described in various representative embodiments.

As shown in the drawings for purposes of illustration, novel resonators whose resonant frequencies and frequency drift characteristics can be appropriately adjusted to result in oscillatory circuits having very small frequency drift vs. temperature characteristics. Appropriate paired resonators can be fabricated using integrated circuit techniques with resultant advantages in cost and size over quartz crystals which have been used in the past to obtain comparable frequency drift characteristics. Previously, crystals of quartz have been carefully cut and tuned to provide a low frequency drift relative to temperature.

In representative embodiments, two resonators that drift with temperature at different rates are used in oscillator circuits to create a "beat" frequency whose net temperature drift is very small, if not zero, over the full temperature range standard for cell phones, portable computers, and other comparable devices. The resonators can be fabricated as thin film bulk acoustic resonators (FBARS) and combined with other integrated circuit circuitry to result in a silicon chip that could be approximately 0.2 millimeters (mm) thick and less than 1×1 mm$^2$ in area. In addition, the output signal can be at a much higher frequency than that of a quartz resonator and, thus, can be relatively free of spurious modes. As a result, less power is consumed in making the needed "clean" high frequency tones.

In the following detailed description and in the several figures of the drawings, like elements are identified with like reference numerals.

FIG. 1 is a drawing of a block diagram of an oscillatory circuit 100 as described in various representative embodiments. In FIG. 1, the oscillatory circuit 100 comprises a first oscillator 110, a second oscillator 120, a mixer circuit 130, and a filter 140. The first oscillator 110 comprises a first resonator 111 and a first amplifier 112. The second oscillator 120 comprises a second resonator 121 and a second amplifier 122.

The output of the first amplifier 112 is fed back to the input of the first amplifier 112 via the first resonator 111 which results in the first oscillator 110 generating a first oscillating signal 115 at a first frequency $f_{01}$ with the first frequency $f_{01}$ being the resonant frequency of the first resonator 111.

The output of the second amplifier 122 is fed back to the input of the second amplifier 122 via the second resonator 121 which results in the second oscillator 120 generating a second oscillating signal 125 at a second frequency $f_{02}$ with the second frequency $f_{02}$ being the resonant frequency of the second resonator 121.

In the representative embodiment of FIG. 1, the second frequency $f_{02}$ is greater than first frequency $f_{01}$. The details shown in FIG. 1 for the first and second oscillators 110,120 are for illustrative purposes only. Various configurations of oscillator circuits could be used with the first and second resonators 111,121.

The mixer circuit 130 receives the first oscillating signal 115 at first frequency $f_{01}$ from the first oscillator 110 and receives the second oscillating signal 125 at second frequency $f_{02}$ from the second oscillator 120. The first oscillating signal 115 and the second oscillating signal 125 are mixed by the mixer circuit 130 to generate a mixer signal 135. The mixer signal 135 comprises a signal component 136 (see FIG. 2A) at a beat frequency $f_B$ wherein the beat frequency $f_B$ is equal to the first frequency $f_{01}$ subtracted from second frequency $f_{02}$, as well as other signal component 137 (see FIG. 2A) at a sum frequency $f_S$ equal to the sum of the first frequency $f_{01}$ and the second frequency $f_{02}$.

The filter 140 receives the mixer signal 135 from the mixer circuit 130, passes the signal components 136 of the mixer signal 135 at beat frequency $f_B$, and inhibits other signal components 137 of the mixer signal 135 at sum frequency $f_S$ with resultant filter signal 145, also referred to herein as output signal 145, as its output. As a result, the filter signal 145 comprises primarily a signal at the beat frequency $f_B$ which was transformed by the transfer function of the filter 140. Typically, any component of the filter signal 145 at the sum frequency $f_S$ will be significantly reduced by the transfer function of the filter 140.

Figure 2A:
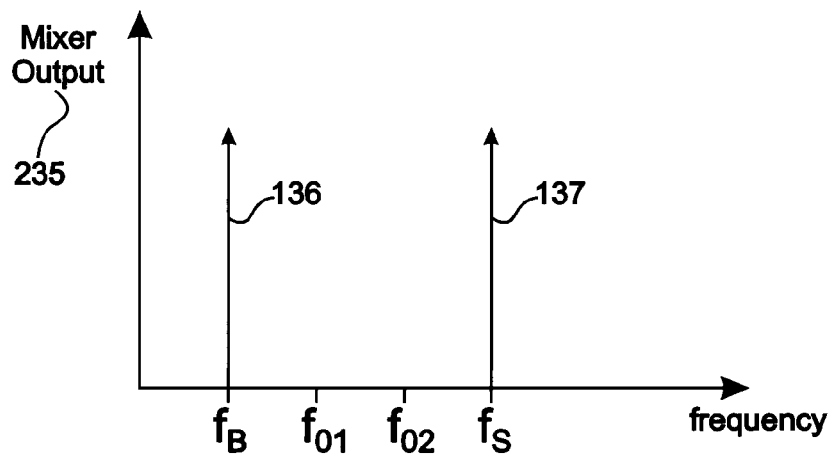
FIG. 2A is a plot of mixer output vs. frequency for components of the mixer signal in FIG. 1.

FIG. 2A is a plot of mixer output 235 vs. frequency for components of the mixer signal 135 in FIG. 1. The mixer output 235 is the mixer signal 135 which, as stated above, comprises the signal component 136 at beat frequency $f_B$ and the other signal component 137 at sum frequency $f_S$. Both the signal component 136 and the other signal component 137 are shown in FIG. 2A. The signal component 136 is plotted at beat frequency $f_B=(f_{02}-f_{01})$ and the other signal component 137 at sum frequency $f_S=(f_{02}+f_{01})$. Also in FIG. 2A, the first frequency $f_{01}$ and the second frequency $f_{02}$ are shown in relative positions.

Figure 2B:
FIG. 2B is a plot of a transfer function vs. frequency for the filter in FIG. 1.

FIG. 2B is a plot of a transfer function 250 vs. frequency for the filter 140 of FIG. 1. In the representative embodiment of FIG. 2B, the filter 140 is a low pass filter 140. However, various filter 140 configurations could be used so long as the transfer function 250 of the filter 140 passes the signal component 136 of the mixer signal 135 at beat frequency $f_B$, and inhibits other important components, such as other signal component 137 of the mixer signal 135 at sum frequency $f_S$. As such and as previously stated, the filter signal 145 at the output of the filter 140 comprises primarily the signal at the beat frequency $f_B$ which was transformed by the transfer function 250 of the filter 140. Typically, any component of the filter signal 145 at the sum frequency $f_S$ will then be significantly reduced by the transfer function 250 of the filter 140.

Figure 2C:
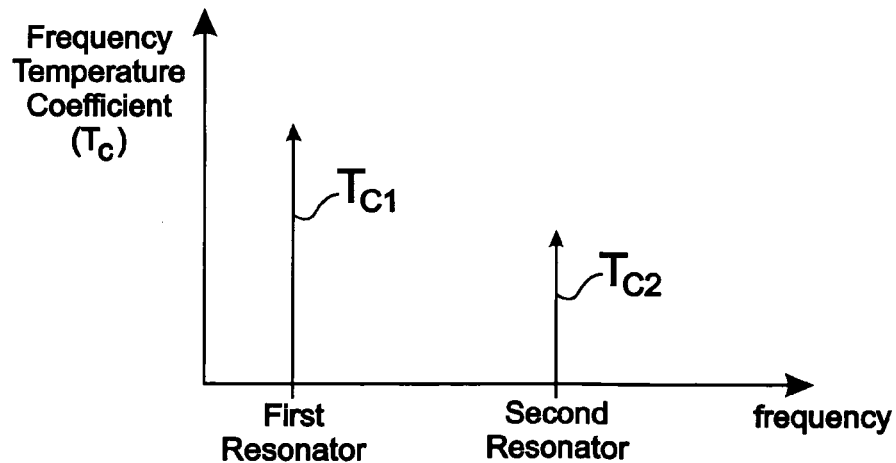
FIG. 2C is a plot of frequency temperature coefficient for the first and second resonate circuits in FIG. 1.

FIG. 2C is a plot of frequency temperature coefficient $T_C$ for the first and second resonators 111,121 in FIG. 1. The value of the frequency temperature coefficient $T_C$ for a resonant circuit at reference frequency $f_R$ is given by $T_C=(1/f_R)(\Delta f_R/\Delta t)$, where $\Delta f_R$ is the frequency shift in $f_R$ caused by a temperature change of $\Delta t$. The value of the frequency temperature coefficient $T_C$ is typically expressed as parts per million per degree Centigrade (ppm/°C.). Assuming no other significant frequency dependent components in a given oscillator, the value of the temperature coefficient for that oscillator will be the same as that of its resonant circuit. The first resonator 111 has a first frequency temperature coefficient $T_{C1}$, and the second resonant 121 has a second frequency temperature coefficient $T_{C2}$. Note that the value of the second frequency temperature coefficient $T_{C2}$ is less than the first frequency temperature coefficient $T_{C1}$.

The beat frequency $f_B$ of the oscillatory circuit 100 then has a circuit frequency temperature coefficient $T_{CC}$ equal to the second frequency $f_{02}$ multiplied by the second frequency temperature coefficient $T_{C2}$ subtracted from the first frequency $f_{01}$ multiplied by the first frequency temperature coefficient $T_{C1}$ (i.e., $T_{CC}=[f_{02} \times T_{C2}]-[f_{01} \times T_{C1}]$). Thus, the first frequency $f_{01}$, the first frequency temperature coefficient $T_{C1}$, the second frequency $f_{02}$, and the second frequency temperature coefficient $T_{C2}$ can be chosen to appropriately meet the needs of a particular application. Careful adjustment of these parameters can result in the circuit frequency temperature coefficient $T_{CC}$ being comparable to or better than that obtainable by the use of quartz crystals. In fact, it is possible to obtain a zero circuit frequency temperature coefficient $T_{CC}$ by the careful choice and adjustment of these parameters.

Figure 2D:
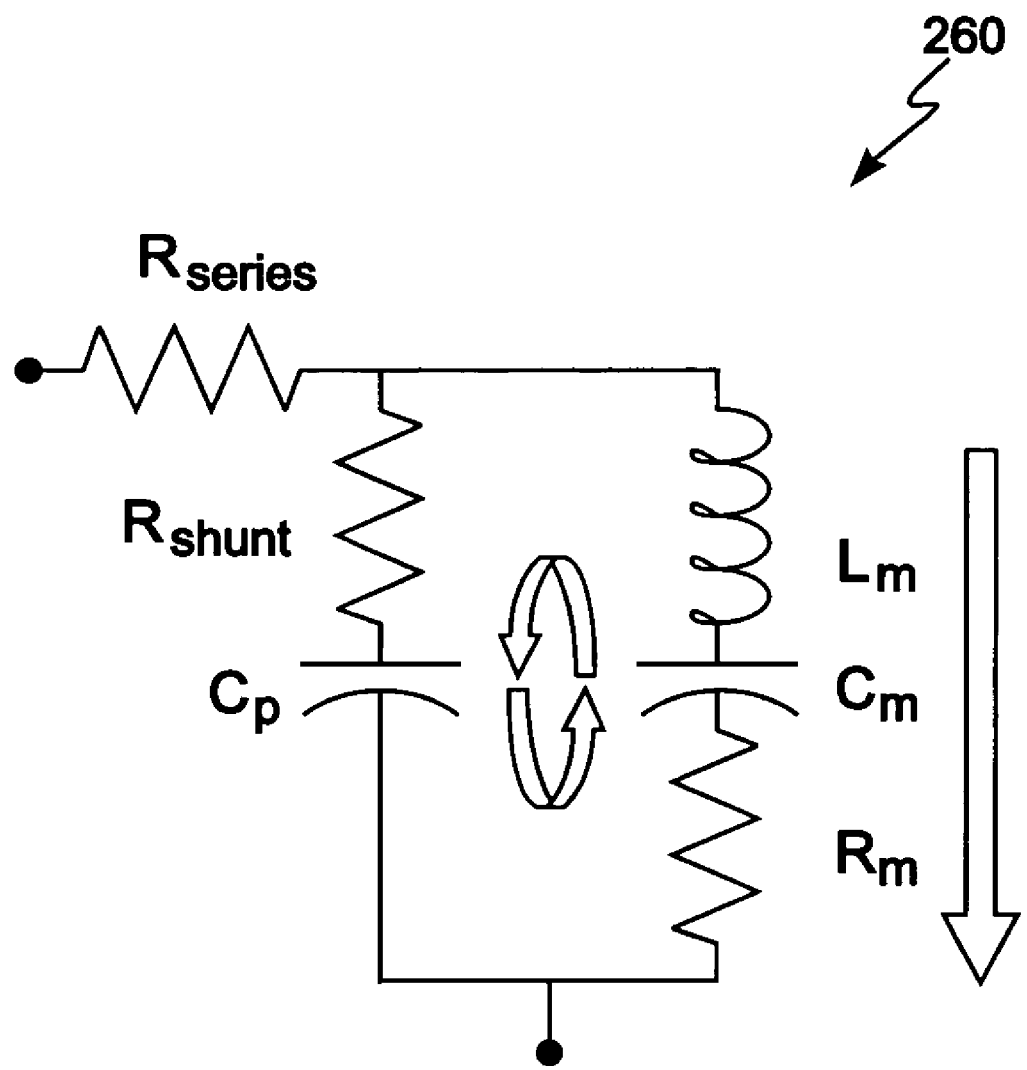
FIG. 2D is a drawing of an equivalent circuit for a thin film bulk acoustic resonator (FBAR).

FIG. 2D is a drawing of an equivalent circuit 260 for a thin film bulk acoustic resonator (FBAR). Thin film bulk acoustic resonators can be used in various representative embodiments herein due to the fact that their fabrication technology is compatible with that of integrated circuits which results in relative advantages in cost, reliability, and size over other technologies. FIG. 2D is a modified Butterworth-Van Dyke model of a thin film bulk acoustic resonator. From this equivalent circuit 260 it can be observed that the thin film bulk acoustic resonator has two resonant frequencies. The first resonant frequency is referred to as series resonant frequency $f_{SER}$ which results from the series combination of inductor $L_M$ and capacitor $C_M$. The second resonant frequency is referred to as parallel resonant frequency $f_{PAR}$ which results from the parallel combination of shunt capacitor $C_P$ and the above series combination of inductor $L_M$ and capacitor $C_M$. The parallel resonant frequency $f_{PAR}$ is also referred to as the anti-resonant frequency $f_{PAR}$. Resistor $R_{SERIES}$ and shunt resistor $R_{SHUNT}$ represent non-ideal, resistive components in the structure. With appropriate choice of filter 140 either the parallel resonant frequency $f_{PAR}$ or the series resonant frequency $f_{SER}$ can be selected in determining the frequency of the resultant output signal 145. In terms of the above and in a given implementation, the first frequency $f_{01}$ could be either the parallel resonant frequency $f_{PAR}$ or the series resonant frequency $f_{SER}$ for the first resonator 111, and the second frequency $f_{02}$ could be either the parallel resonant frequency $f_{PAR}$ or the series resonant frequency $f_{SER}$ for the second resonator 121. As will be recognized by one of ordinary skill in the art, the output of the mixer circuit 130 for two thin film bulk acoustic resonators is a combination of signals at eight separate frequencies rather than the two indicated in FIG. 2A. These eight frequencies are as follows: (1) $f_{PAR-1}+/-f_{PAR-2}$, (2) $f_{PAR-1}+/-f_{SER-2}$, (3) $f_{SER-1}+/-f_{PAR-2}$, and (4) $f_{SER-1}+/-f_{SER-2}$. As a result in any given application, the filter 140 will need to filter the unwanted seven frequencies to the level needed. Since for any given resonator, the parallel resonant frequency $f_{PAR}$ is less than the series resonant frequency $f_{SER}$, an appropriately designed low pass filter 140 could pass only the frequency $(f_{PAR-1}-f_{PAR-2})$.

Figure 3A:
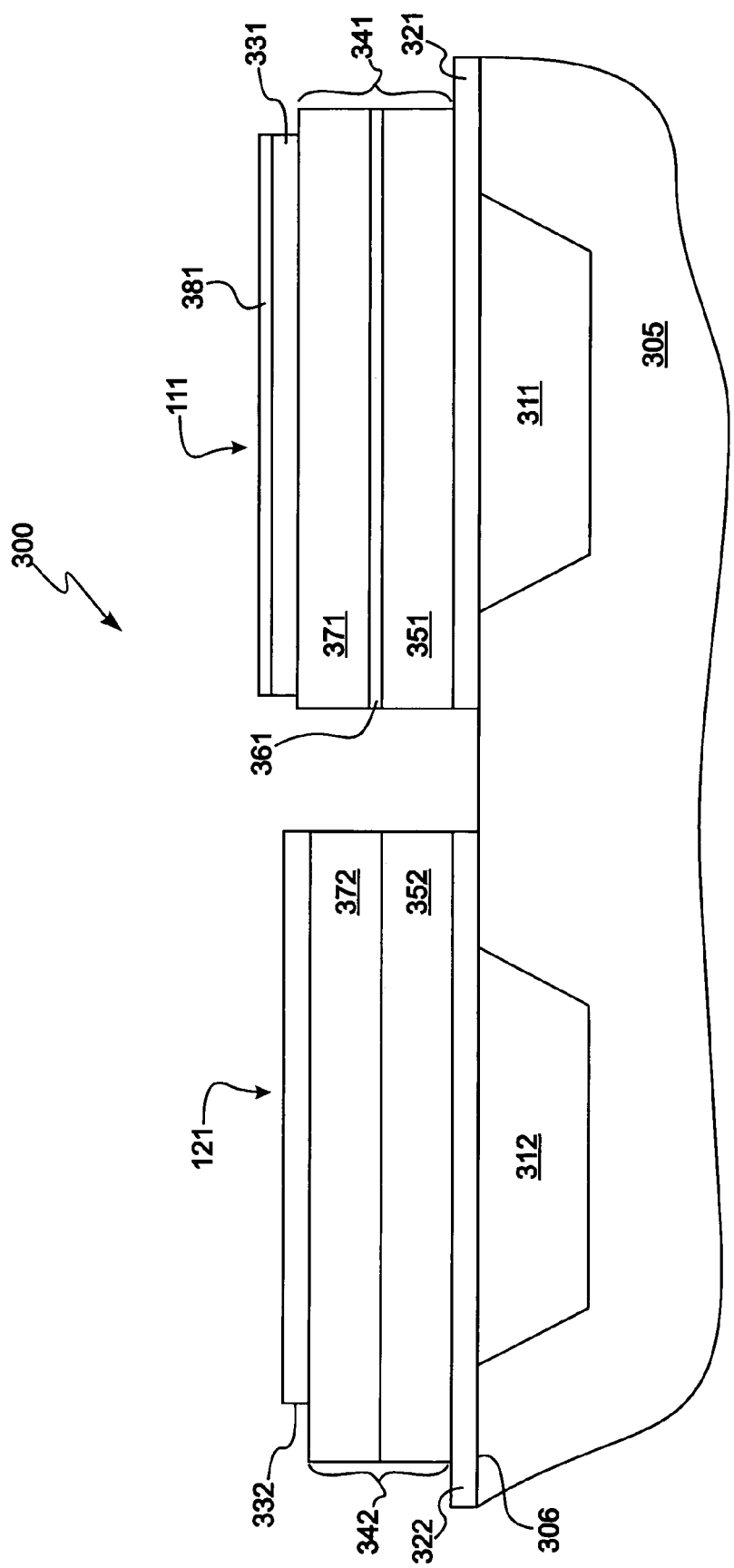
FIG. 3A is a drawing of a resonator structure as described in various representative embodiments.

FIG. 3A is a drawing of a resonator structure 300 as described in various representative embodiments. In FIG. 3A, the pair of resonators 300 comprises the first and the second resonators 111,121 which are shown in a side view and which are fabricated using integrated circuit processing compatible procedures. In this example, the resonators 111,121 are thin film bulk acoustic resonators (FBARs) The resonators 111, 121 are fabricated on a substrate 305 which could be, for example, silicon 305 or other appropriate material, and the resonators 111,121 are fabricated above a first cavity 311 and a second cavity 312, respectively because they are acoustic resonators which utilize mechanical waves. The cavities isolate the vibrating part of the resonators 111,121 from the substrate 305 in order to reduce the vibrational energy that would otherwise be dissipated in the substrate 305. The first and the second cavities 311,312 are created on the top surface 306 of the substrate 305.

The first resonator 111 is fabricated above and bridges the first cavity 311. The first resonator 111 includes a first bottom electrode 321, a first top electrode 331, and a first piezoelectric structure 341 sandwiched between the first bottom electrode 321 and the first top electrode 331. The first piezoelectric structure 341 includes a first bottom piezoelectric layer 351 on top of the first bottom electrode 321, an interstitial layer 361 on top of the first bottom piezoelectric layer 351, and a first top piezoelectric layer 371 on top of the interstitial layer 361. On top of the first top piezoelectric layer 371 is the first top electrode 331. Also shown in FIG. 3A is a mass load layer 381 on top of the first top electrode 331.

The second resonator 121 is fabricated above and bridges the second cavity 312. The second resonator 121 includes a second bottom electrode 322, a second top electrode 332, and a second piezoelectric structure 342 sandwiched between the second bottom electrode 322 and the second top electrode 332. The second piezoelectric structure 342 includes a second bottom piezoelectric layer 352 on top of the second bottom electrode 322 and a second top piezoelectric layer 372 on top of the second bottom piezoelectric layer 352. On top of the second top piezoelectric layer 372 is the second top electrode 332.

The piezoelectric layers 351,352,371,372 could be fabricated using aluminum nitride (AlN) or any suitable piezoelectric material. In the case of aluminum nitride, the piezoelectric layers 351,352,371,372 could be created by vapor deposition at an appropriate processing step. The electrodes 321,322,331,332 could be, for example, molybdenum or any other suitable conductor. Ideally, the interstitial layer 361 has a stiffness coefficient vs. temperature that is greater than that of the piezoelectric layers 351,352,371,372. In such case, the larger stiffness coefficient vs. temperature for the interstitial layer 361 will result in a greater first frequency temperature coefficient $T_{C1}$ than in the second frequency temperature coefficient $T_{C2}$. As molybdenum has a stiffness coefficient vs. temperature that is greater than the stiffness coefficient vs. temperature for aluminum nitride, molybdenum could be used for the interstitial layer 361.

Due to the mass load layer 381 and other design considerations which include the thickness of the interstitial layer 361, as well as the relative thicknesses of the various piezoelectric layers 351,352,371,372, the first resonator 111 can be fabricated with first resonant frequency $f_{o1}$ (i.e., first frequency) that is lower than the second resonant frequency $f_{o2}$ (i.e., second frequency) of the second resonator 121. In general, the greater the weight of the mass load layer 381, the lower will be the resonant frequency of the resonator. Also, the thicker the piezoelectric layer(s), the lower will be the resonant frequency of the resonator.

In general, adding weight to the mass load layer 381 will not appreciably change the frequency temperature coefficient as the mass load layer 381 acts mostly as "dead weight" which does not change with a change in temperature. However, adding more mass loading decreases the first resonant frequency $f_{o1}$ which may or may not be desirable in a given application. The greater the mass loading, the higher the beat frequency $f_B$ will be.

Figure 3B:
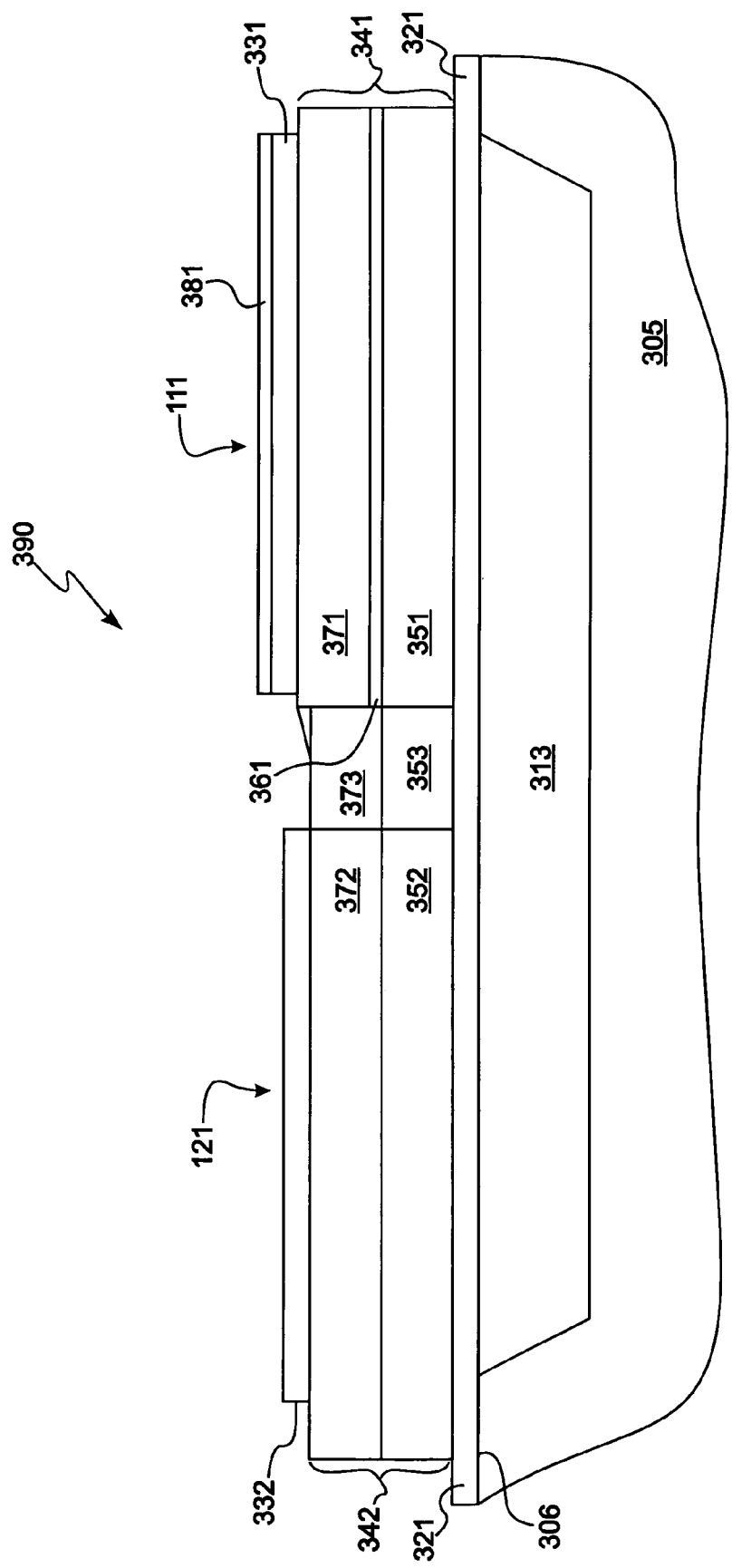
FIG. 3B is a drawing of another resonator structure as described in various representative embodiments.

FIG. 3B is a drawing of another resonator structure 390 as described in various representative embodiments. In FIG. 3B, the pair of resonators 390 comprises the first and the second resonators 111,121 which are shown in a side view and which are fabricated using integrated circuit processing compatible procedures as in FIG. 3A. In this example, the resonators 111,121 are thin film bulk acoustic resonators (FBARs) The resonators 111,121 are fabricated on the substrate 305 which could be, for example, silicon 305 or other appropriate material. In FIG. 3B, as opposed to FIG. 3A, the resonators 111, 121 are fabricated above a single cavity 313, also referred to herein as cavity 313. The single cavity 313 is created on the top surface 306 of the substrate 305. The single cavity 313 isolates the vibrating parts of the resonators 111,121 from the substrate 305 in order to reduce the vibrational energy dissipated in the substrate 305 as in FIG. 3A. However, the structure of FIG. 3B may lead to more vibrational coupling between the two resonators 111,121 than would be found with the structure of FIG. 3A.

The first resonator 111 is fabricated above the single cavity 313. The first resonator 111 includes the first bottom electrode 321, the first top electrode 331, and the first piezoelectric structure 341 sandwiched between the first bottom electrode 321 and the first top electrode 331. The first piezoelectric structure 341 includes the first bottom piezoelectric layer 351 on top of the first bottom electrode 321, the interstitial layer 361 on top of the first bottom piezoelectric layer 351, and the first top piezoelectric layer 371 on top of the interstitial layer 361. On top of the first top piezoelectric layer 371 is the first top electrode 331. Also shown in FIG. 3B is the mass load layer 381 on top of the first top electrode 331.

The second resonator 121 is also fabricated above the single cavity 313. The second resonator 121 includes the first bottom electrode 321 in common with the first resonator 111, the second top electrode 332, and the second piezoelectric structure 342 sandwiched between the first bottom electrode 321 and the second top electrode 332. The second piezoelectric structure 342 includes the second bottom piezoelectric layer 352 on top of the first bottom electrode 321 and the second top piezoelectric layer 372 on top of the second bottom piezoelectric layer 352. On top of the second top piezoelectric layer 372 is the second top electrode 332. For structural purposes, FIG. 3B also indicates a bottom connecting piezoelectric layer 353 and a top connecting piezoelectric layer 373.

As in FIG. 3A, the piezoelectric layers 351,352,371,372 could be fabricated using aluminum nitride (AlN) or any suitable piezoelectric material. In the case of aluminum nitride, the piezoelectric layers 351,352,371,372 could be created by vapor deposition at an appropriate processing step. The electrodes 321,322,331,332 could be, for example, molybdenum or any other suitable conductor. Ideally, the interstitial layer 361 has a stiffness coefficient vs. temperature that is greater than that of the piezoelectric layers 351,352, 371,372. In such case, the larger stiffness coefficient vs. temperature for the interstitial layer 361 will result in a greater first frequency temperature coefficient $T_{C1}$ than in the second frequency temperature coefficient $T_{C2}$. As molybdenum has a stiffness coefficient vs. temperature that is greater than the stiffness coefficient vs. temperature for aluminum nitride, molybdenum could be used for the interstitial layer 361.

Due to the mass load layer 381 and other design considerations which include the thickness of the interstitial layer 361, as well as the relative thicknesses of the various piezoelectric layers 351,352,371,372, the first resonator 111 can be fabricated with first resonant frequency $f_{o1}$ (i.e., first frequency) that is lower than the second resonant frequency $f_{o2}$ (i.e., second frequency) of the second resonator 121.

Figure 3C:
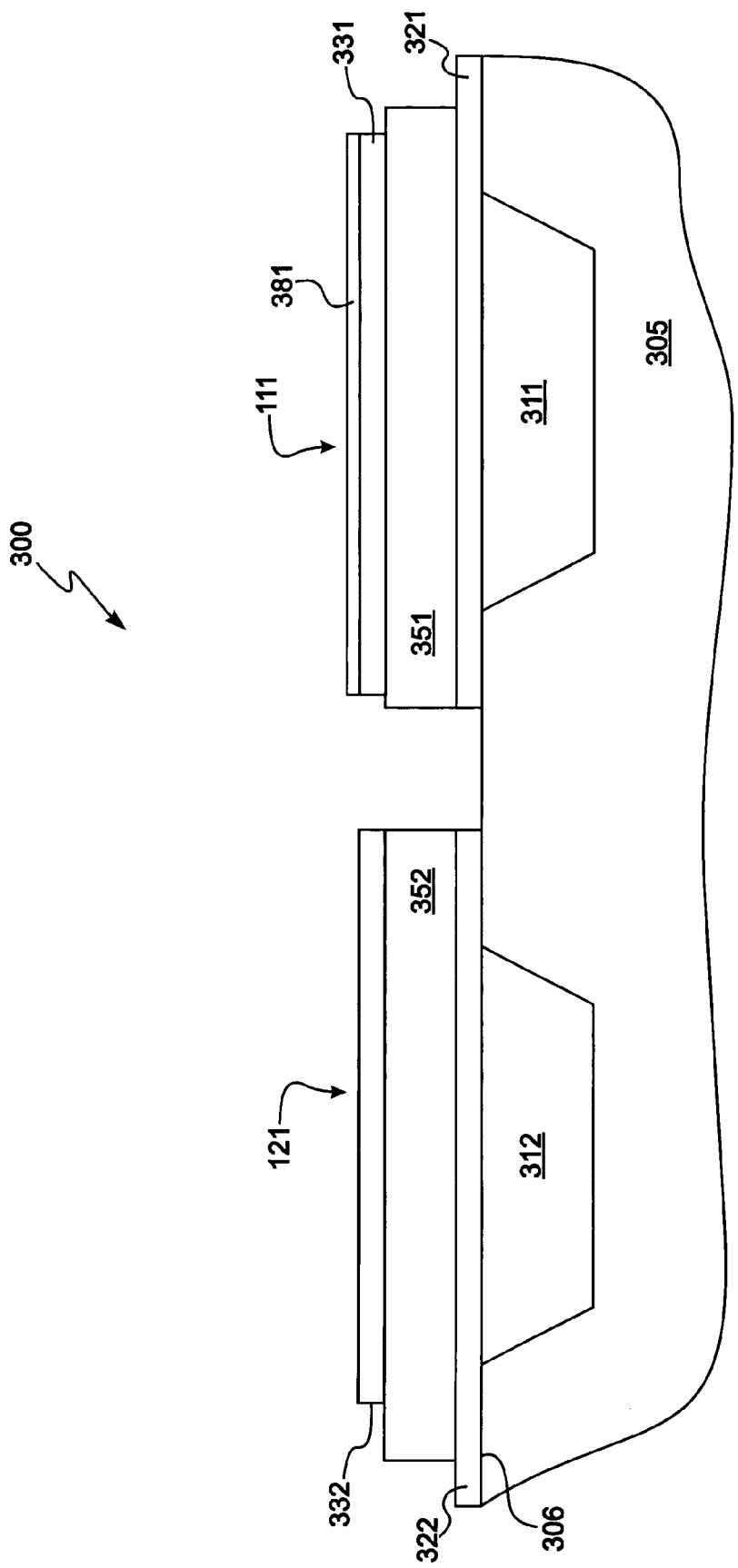
FIG. 3C is a drawing of still another resonator structure as described in various representative embodiments.

FIG. 3C is a drawing of still another resonator structure 300 as described in various representative embodiments. In the alternative embodiment of FIG. 3C, the interstitial layer 361 of the first resonator 111 is omitted as opposed to the resonator structures 300,390 of FIGS. 3A and 3B. In FIG. 3C, the pair of resonators 300 comprises the first and the second resonators 111,121 which are shown in a side view and which are fabricated using integrated circuit processing compatible procedures. In this example, the resonators 111,121 are thin film bulk acoustic resonators (FBARs) The resonators 111, 121 are fabricated on a substrate 305 which could be, for example, silicon 305 or other appropriate material, and the resonators 111,121 are fabricated above a first cavity 311 and a second cavity 312, respectively because they are acoustic resonators which utilize mechanical waves. The cavities isolate the vibrating part of the resonators 111,121 from the substrate 305 in order to reduce the vibrational energy that would otherwise be dissipated in the substrate 305. The first and the second cavities 311,312 are created on the top surface 306 of the substrate 305.

The first resonator 111 is fabricated above and bridges the first cavity 311. The first resonator 111 comprises the first bottom electrode 321, first piezoelectric layer 351 (first bottom piezoelectric layer 351), first top electrode 331, and mass load layer 381. The first piezoelectric layer 351 lies on top of the first bottom electrode 321; the first top electrode 331 lies on top of the first piezoelectric layer 351; and the mass load layer 381 lies on top of the first top electrode 331.

The second resonator 121 is fabricated above and bridges the second cavity 312. The second resonator 121 comprises the second bottom electrode 322, second piezoelectric layer 352 (second bottom piezoelectric layer 352), and second top electrode 332. The second piezoelectric layer 352 lies on top of the second bottom electrode 322; and the second top electrode 332 lies on top of the second piezoelectric layer 352.

The piezoelectric layers 351,352 could be fabricated using aluminum nitride (AlN) or any suitable piezoelectric material. In the case of aluminum nitride, the piezoelectric layers 351,352 could be created by vapor deposition at an appropriate processing step. The electrodes 321,322,331,332 could be, for example, molybdenum or any other suitable conductor.

Preferably, the mass load layer 381 in the embodiment of FIG. 3C is a material that experiences a large stiffness change with temperature, in particular larger than that of the second top electrode 332. The mass load layer 381 could be an oxide. Further, the mass load layer 381 could be an organic material which could be PMMA (Polymethyl-methacrylate), PY (a member of the Polyimide family of organic materials), BCB (Benzocyclobutene), or other appropriate material. The mass load layer 381 could also be a resin. This resin could be a low-k dielectric resin. Low-k materials typically have dielectric constants less than or equal to 3.5. An example of an appropriate low-k dielectric resin is Dow Chemical's SiLK material. SiLK is an organic material that softens with temperature. As such, the larger stiffness coefficient vs. temperature of the mass load layer 381 will result in a greater first frequency temperature coefficient $T_{C1}$ than in the second frequency temperature coefficient $T_{C2}$. An additional protective layer may overlay the mass load layer 381.

Due to the mass load layer 381, the first resonator 111 can be fabricated with first resonant frequency $f_{o1}$ (i.e., first frequency) that is lower than the second resonant frequency $f_{o2}$ (i.e., second frequency) of the second resonator 121. In general, the greater the weight of the mass load layer 381, the lower will be the resonant frequency of the resonator. Also, the thicker the piezoelectric layer(s), the lower will be the resonant frequency of the resonator.

For this representative embodiment wherein the material of the mass load layer 381 differs from the material of the first and second top electrodes 331,332, the thickness and material of the mass load layer 381 can appreciably change the frequency temperature coefficient as the stiffness of the mass load layer 381 changes with a change in temperature. The greater the mass loading, the higher the beat frequency $f_B$ will be.

In representative embodiments, the first and second resonators 111,121 could also be constructed over only a single cavity 313 similar to that of FIG. 3B.

Figure 3D:
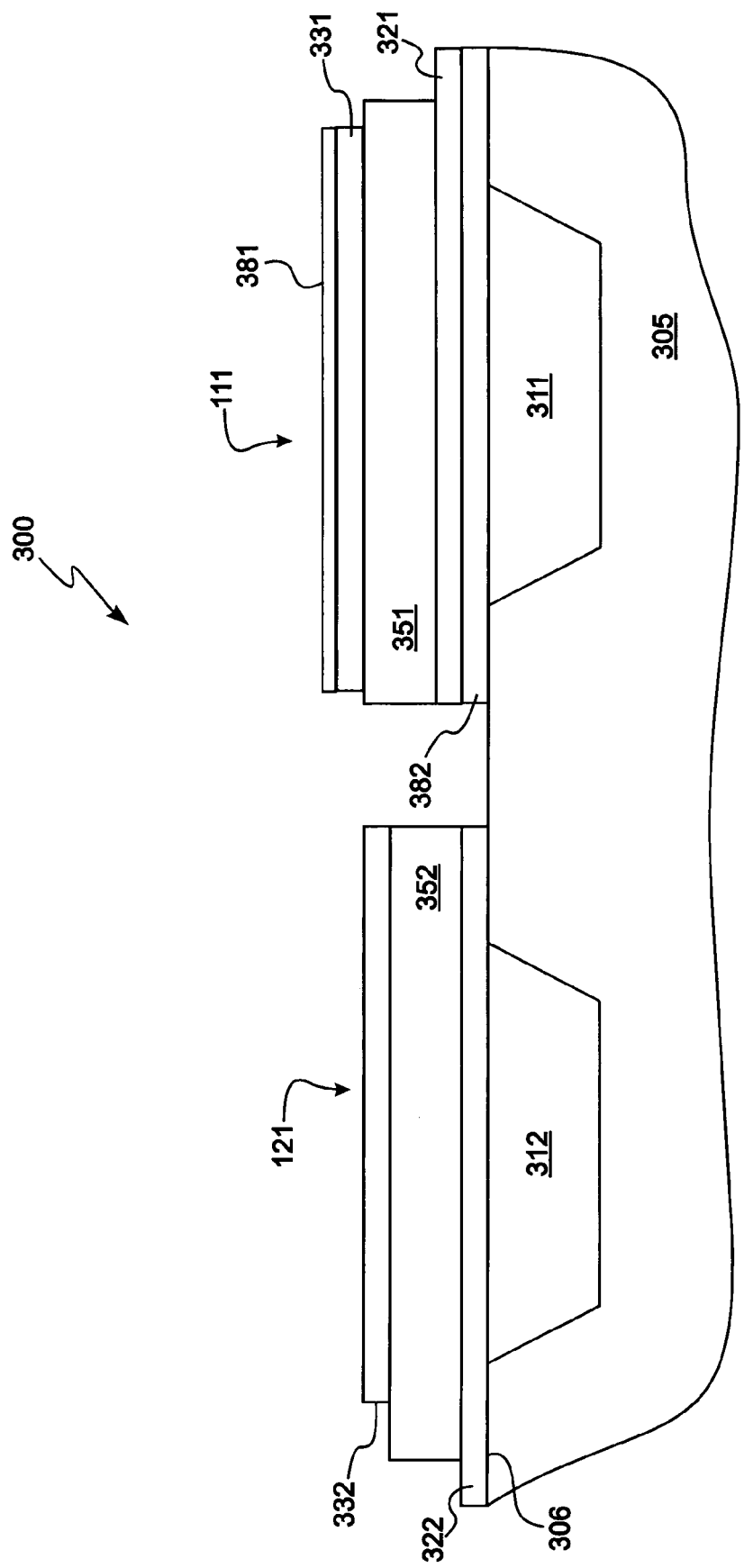
FIG. 3D is a drawing of yet another resonator structure as described in various representative embodiments.

FIG. 3D is a drawing of yet another resonator structure 300 as described in various representative embodiments. In the alternative embodiment of FIG. 3D as in FIG. 3C, the interstitial layer 361 of the first resonator 111 is omitted as opposed to the resonator structures 300,390 of FIGS. 3A and 3B. In FIG. 3D, the pair of resonators 300 comprises the first and the second resonators 111,121 which are shown in a side view and which are fabricated using integrated circuit processing compatible procedures. In this example, the resonators 111,121 are thin film bulk acoustic resonators (FBARs) The resonators 111,121 are fabricated on a substrate 305 which could be, for example, silicon 305 or other appropriate material, and the resonators 111,121 are fabricated above a first cavity 311 and a second cavity 312, respectively because they are acoustic resonators which utilize mechanical waves. The cavities isolate the vibrating part of the resonators 111, 121 from the substrate 305 in order to reduce the vibrational energy that would otherwise be dissipated in the substrate 305. The first and the second cavities 311,312 are created on the top surface 306 of the substrate 305.

The first resonator 111 is fabricated above and bridges the first cavity 311. The first resonator 111 comprises a bottom mass load layer 382, the first bottom electrode 321, first piezoelectric layer 351 (first bottom piezoelectric layer 351), first top electrode 331, and optional mass load layer 381. The first bottom electrode 321 lies on top of the bottom mass load layer 382; the first piezoelectric layer 351 lies on top of the first bottom electrode 321; the first top electrode 331 lies on top of the first piezoelectric layer 351; and the optional mass load layer 381 lies on top of the first top electrode 331.

Preferably, the bottom mass load layer 382 in the embodiment of FIG. 3D is a material that experiences a large stiffness change with temperature, in particular larger than that of the second bottom electrode 322. The bottom mass load layer 382 could be an oxide. Further, the bottom mass load layer 382 could be an organic material which could be PMMA (Polymethyl-methacrylate), PY (a member of the Polyimide family of organic materials), BCB (Benzocyclobutene), or other appropriate material. The bottom mass load layer 382 could also be a resin. This resin could be a low-k dielectric resin. Low-k materials typically have dielectric constants less than or equal to 3.5. An example of an appropriate low-k dielectric resin is Dow Chemical's SiLK material. SiLK is an organic material that softens with temperature. As such, the larger stiffness coefficient vs. temperature of the bottom mass load layer 382 will result in a greater first frequency temperature coefficient $T_{C1}$ than in the second frequency temperature coefficient $T_{C2}$.

The second resonator 121 is fabricated above and bridges the second cavity 312. The second resonator 121 comprises the second bottom electrode 322, second piezoelectric layer 352 (second bottom piezoelectric layer 352), and second top electrode 332. The second piezoelectric layer 352 lies on top of the second bottom electrode 322; and the second top electrode 332 lies on top of the second piezoelectric layer 352.

The piezoelectric layers 351,352 could be fabricated using aluminum nitride (AlN) or any suitable piezoelectric material. In the case of aluminum nitride, the piezoelectric layers 351,352 could be created by vapor deposition at an appropriate processing step. The electrodes 321,322,331,332 could be, for example, molybdenum or any other suitable conductor. The mass load layer 381 could be, for example, molybdenum or any other suitable material.

Due to the bottom mass load layer 382, the first resonator 111 can be fabricated with first resonant frequency $f_{o1}$ (i.e., first frequency) that is lower than the second resonant frequency $f_{o2}$ (i.e., second frequency) of the second resonator 121. In general, the greater the weight of the bottom mass load layer 382 and the weight of the mass load layer 381, the lower will be the resonant frequency of the resonator. Also, the thicker the piezoelectric layer(s), the lower will be the resonant frequency of the resonator.

For this representative embodiment wherein the material of the bottom mass load layer 382 differs from the material of the second bottom electrode 322, the thickness and material of the bottom mass load layer 382 can appreciably change the frequency temperature coefficient as the stiffness of the bottom mass load layer 382 changes with a change in temperature. The greater the mass loading, the higher the beat frequency $f_B$ will be.

In representative embodiments, the first and second resonators 111,121 could also be constructed over only a single cavity 313 similar to that of FIG. 3B.

Figure 4:
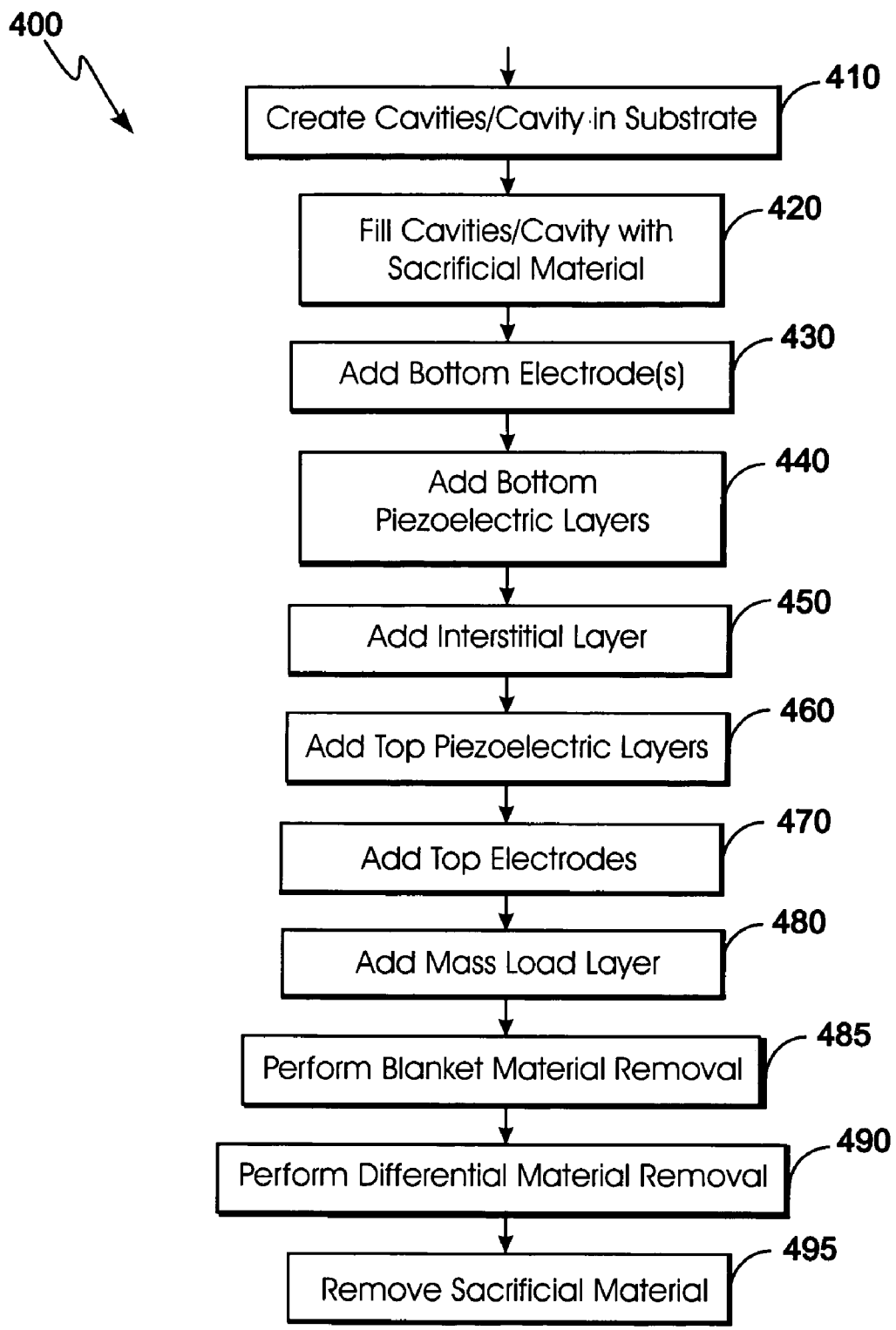
FIG. 4 is a flow chart of a method for fabricating the resonator structures of FIGS. 3A and 3B.

FIG. 4 is a flow chart of a method 400 for fabricating the resonator structures 300,390 of FIGS. 3A and 3B. In block 410, for the resonator structure 300 of FIG. 3A, the cavities 311,312 are etched into the substrate 305. However, for the other resonator structure 390 of FIG. 3B, only the single cavity 313 is etched into the substrate 305. Block 410 then transfers control to block 420.

In block 420, for the resonator structure 300 of FIG. 3A, the cavities 311,312 are filled with a sacrificial material. For the other resonator structure 390 of FIG. 3B, the single cavity 313 is filled with the sacrificial material. The sacrificial material can be removed later and could be a phosphorous silica glass material. Block 420 then transfers control to block 430.

In block 430, for the resonator structure 300 of FIG. 3A, the first and second bottom electrodes 321,322 are fabricated. For the other resonator structure 390 of FIG. 3B, the first bottom electrode 321 is fabricated. In the case of FIG. 3A, the first and second bottom electrodes 321,322 or, in the case of FIG. 3B, the first bottom electrode 321 can be fabricated using well known technologies such as metal deposition and photolithography. As an example, a layer of molybdenum could be deposited onto a wafer followed by the spinning of photoresist onto the wafer, the photoresist could be exposed to appropriately pattern the photoresist, the photoresist could be subsequently developed, and then the molybdenum could be etched. Block 430 then transfers control to block 440.

In block 440, the bottom piezoelectric layers 351,352 (which could be the same layer deposited at the same time and referred to herein collectively prior to patterning as the bottom wafer piezoelectric layer 350) are deposited above the bottom electrodes 321,322 for the resonator structure 300 of FIG. 3A. For the other resonator structure 390 of FIG. 3B, the bottom piezoelectric layers 351,352 are deposited above the first bottom electrode 321. Again, well known photolithography steps are used to define and create the first and second bottom piezoelectric layers 351,352. As an example, a layer of aluminum nitride could be deposited onto a wafer followed by the spinning of photoresist onto the wafer, the photoresist could be exposed to appropriately pattern the photoresist, the photoresist could be subsequently developed, and then the aluminum nitride could be etched. Block 440 then transfers control to block 450.

In block 450, the interstitial layer 361 is added on top of the first bottom piezoelectric layer 351 of the first resonator 111. The interstitial layer 361 can be fabricated using well known technologies such as metal deposition and photolithography. As an example a layer of molybdenum could be deposited onto a wafer followed by the spinning of photoresist onto the substrate 305. The photoresist could be exposed to appropriately pattern the photoresist, the photoresist could be subsequently developed, and then the molybdenum could be etched. Block 450 then transfers control to block 460.

In block 460, the top piezoelectric layers 371,372 (which could be the same layer deposited at the same time and referred to herein collectively prior to patterning as the top wafer piezoelectric layer 370) are deposited above the interstitial layer 361 in the first resonator 111 and above the second bottom piezoelectric layer 352 in the second resonator 121. Again, well known photolithography steps are used to define and create the first and second top piezoelectric layers 371, 372. As an example, a layer of aluminum nitride could be deposited onto the wafer followed by the spinning of photoresist onto the wafer, the photoresist could be exposed to appropriately pattern the photoresist, the photoresist could be subsequently developed, and then the aluminum nitride could be etched. Block 460 then transfers control to block 470.

In block 470, the first and second top electrodes 331,332 are fabricated. The first and second top electrodes 371,372 can be fabricated using well known technologies such as metal deposition and photolithography. As an example a layer of molybdenum could be deposited onto the top piezoelectric layers 371,372 followed by the spinning of photoresist onto the deposited molybdenum. The photoresist could be exposed to appropriately pattern the photoresist, the photoresist could be subsequently developed, and then the molybdenum could be etched to create the first and second top electrodes 331, 332. Block 470 then transfers control to block 480.

In block 480, the mass load layer 381 is added on top of the first top electrode 331 of the first resonator 111. The mass load layer 381 can be fabricated using well known technologies such as metal deposition and photolithography. As an example, a layer of molybdenum or other material could be deposited onto a wafer followed by the spinning of photoresist onto the wafer. The photoresist could be exposed to appropriately pattern the photoresist, the photoresist could be subsequently developed, and then the molybdenum could be etched to leave the mass load layer 381 over the first top electrode 331. Block 480 then transfers control to block 485.

In block 485, a portion of the thickness of the first top electrode 331 and a portion of the thickness of the second top electrode 332 are removed or a portion of the thickness of the second top electrode 332 and a portion of the thickness of the mass load layer 381 are removed. As appropriate the actions of block 485 can instead occur prior to the actions of block 480. Block 485 then transfers control to block 490.

In block 490, a portion of the thickness of first piezoelectric layer 351 is removed while maintaining the thickness of the second piezoelectric layer 352, a portion of the thickness of second piezoelectric layer 352 is removed while maintaining the thickness of the first piezoelectric layer 351, a portion of the thickness of the first top electrode 331 is removed while maintaining the thickness of the second top electrode 332, a portion of the thickness of the second top electrode 332 is removed while maintaining the thickness of the first top electrode 331, a portion of the thickness of the mass load layer 381 is removed while maintaining the thickness of the second top electrode 332, or a portion of the thickness the second top electrode 332 is removed while maintaining the thickness of the mass load layer 381. As appropriate the actions of block 490 can instead occur prior to the actions of block 470 or prior to the actions of block 480. Block 490 then transfers control to block 495.

In block 495, for the resonator structure 300 of FIG. 3A, the sacrificial material previously deposed in the cavities 311,312 is removed. For the other resonator structure 390 of FIG. 3B, the sacrificial material previously deposed in the single cavity 313 is removed. Should the sacrificial material be a glass, hydrofluoric acid can be used to etch it from the cavities 311,312 or the single cavity 313 as appropriate. Block 495 then terminates the process.

As an example, first oscillator 110 can use first resonator 111 to generate first oscillating signal 115 at first frequency $f_{o1}$ of 2.3 GHz, and second oscillator 120 can use second resonator 121 to generate second oscillating signal 125 at second frequency $f_{o2}$ of 2.0 GHz. The beat frequency $f_B$ would then be at 300 MHz.

As will be known to one skilled in the art, in other representative embodiments, various changes can be made to the above described processes to effect similar structures to those just described. In particular, the above process could be modified such that only the first resonator 111 of FIG. 3A is fabricated on the substrate 305. In such case, both the first frequency $f_{01}$ and the frequency temperature coefficient $T_C$ can be modified using the above teachings. If the interstitial layer 361 has a stiffness coefficient vs. temperature that is less than that of the first bottom piezoelectric layer 351 and the first top piezoelectric layer 371, the first frequency temperature coefficient $T_{C1}$ will be less than it would be without the presence of the interstitial layer 361. Regardless, by adjusting the parameters of the interstitial layer 361, the first frequency temperature coefficient $T_{C1}$ can be adjusted. Further, by including an additional photolithographic step in connection with an ion milling step, either or both of the first and the second frequencies $f_{01}, f_{02}$ could be modified. Also, by appropriate removal of certain steps, for example the steps in (1) block 450 (add interstitial layer) and in (2) block 460 (add top piezoelectric layers), the representative embodiment of FIG. 3C could be constructed.

Figure 5A:
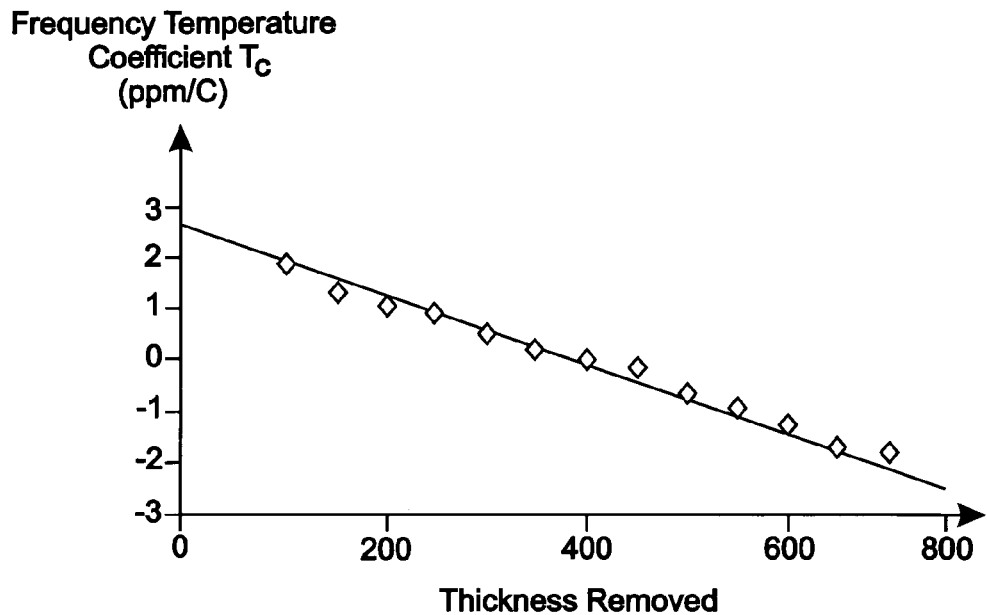
FIG. 5A is a plot of circuit frequency temperature coefficient vs. thickness of removed top wafer piezoelectric layer for the resonator structure of FIG. 3A.
Figure 5B:
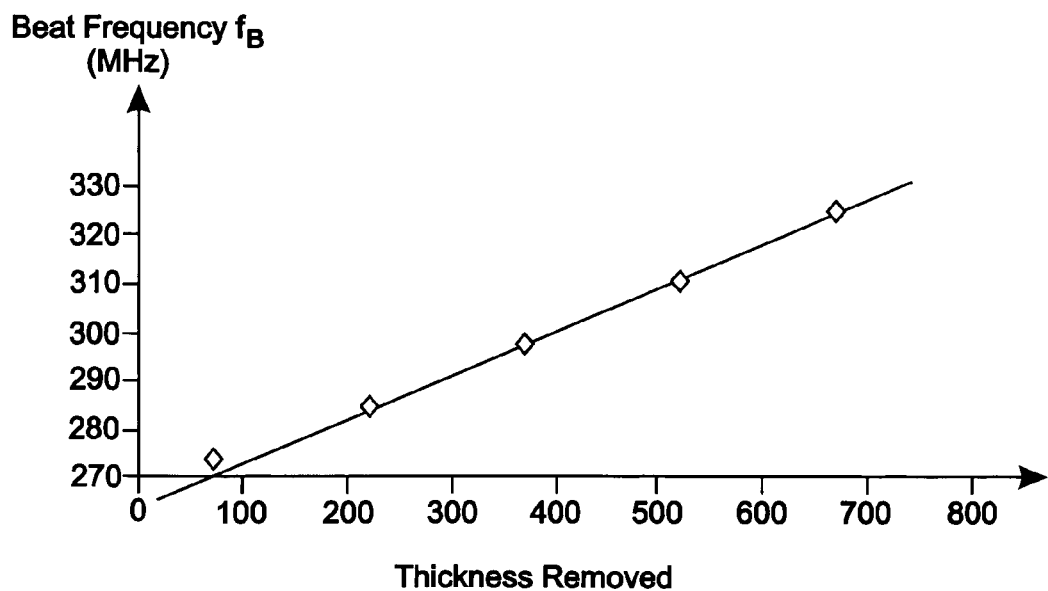
FIG. 5B is a plot of beat frequency vs. thickness of removed top wafer piezoelectric layer for the resonator structure of FIG. 3A.

FIG. 5A is a plot of circuit frequency temperature coefficient $T_{CC}$ vs. thickness removed of top resonator layer 395 for the resonator structures 300,390 of FIGS. 3A-3B. The mass load layer 381 and the second top electrode 332 are collectively referred to herein as the top resonator layer 395 which is not specifically identified in the drawings. FIG. 5B is a plot of beat frequency $f_B$ vs. thickness of removed top resonator layer 395 for the resonator structure 300 of FIG. 3A and the other resonator structure 390 of FIG. 3B. In FIGS. 5A-5B, the top resonator layer 395 material is removed using a blanket removal process, which could be an ion mill, across the wafer that removes equal amounts of the mass load layer 381 and the second top electrode 332. The blanket ion mill adjusts both the first and the second resonant frequencies $f_{01}, f_{02}$ of the first and the second resonators 111,121, as well as the first and the second frequency temperature coefficients $T_{C1}, T_{C2}$ of the first and the second resonators 111,121. In so doing, the blanket ion mill adjusts both the resultant beat frequency $f_B$ of the oscillatory circuit 100 and the final temperature drift (the circuit frequency temperature coefficient $T_{CC}$) of the beat frequency $f_B$. Thus, the blanket ion mill can be used to target either the beat frequency $f_B$ of the oscillatory circuit 100 or the final temperature drift (the circuit frequency temperature coefficient $T_{CC}$) of the beat frequency $f_B$ but not both. The blanket ion mill could also be performed on the first and the second top electrodes 331,332 prior to the addition of the mass load layer 381.

Figure 6A:
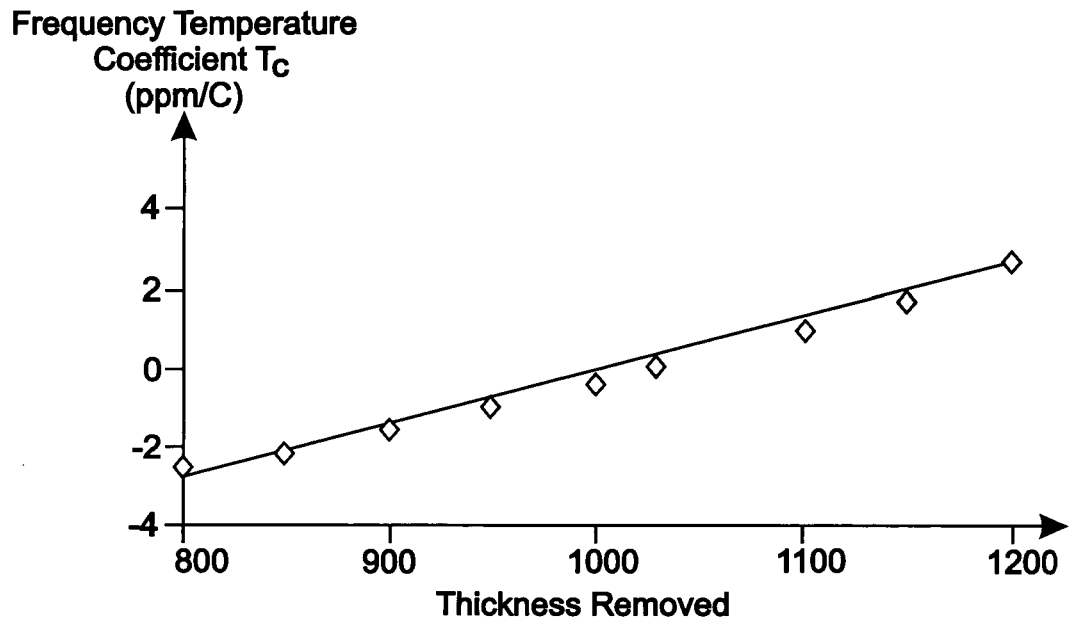
FIG. 6A is a plot of circuit frequency temperature coefficient vs. the mass loading removed from the first resonator for the resonator structure of FIG. 3A.
Figure 6B:
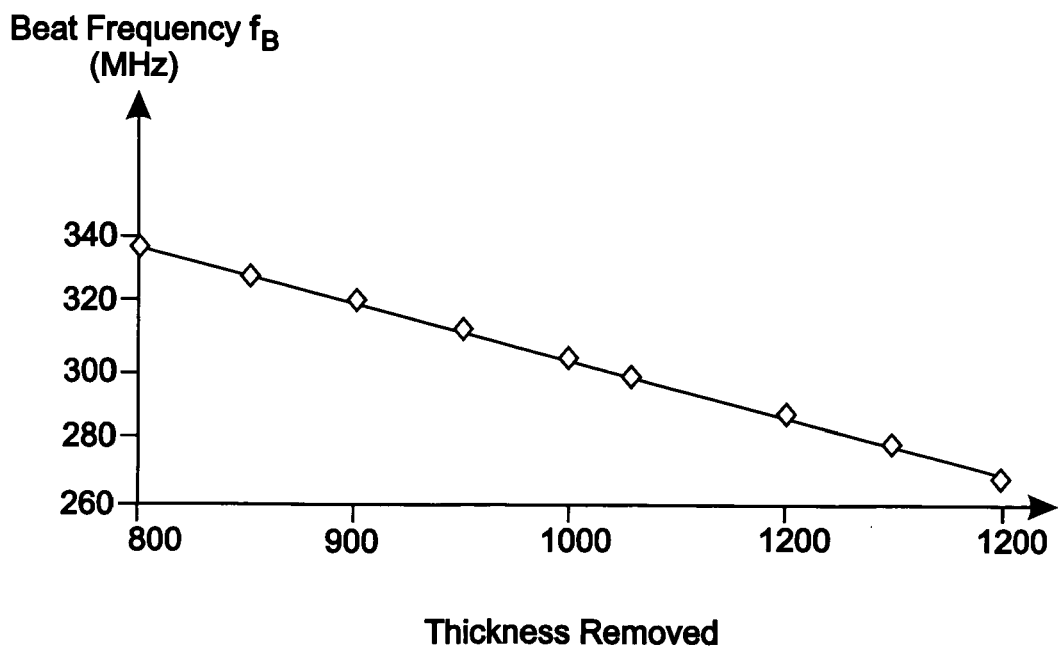
FIG. 6B is a plot of beat frequency vs. the mass loading removed from the first resonator for the resonator structure of FIG. 3A.

FIG. 6A is a plot of circuit frequency temperature coefficient $T_{CC}$ vs. thickness removed of the mass load layer 381 for the resonator structures 300,390 of FIGS. 3A-3B. FIG. 6B is a plot of beat frequency $f_B$ vs. thickness removed of the mass load layer 381 for the resonator structures 300,390 of FIGS. 3A-3B. In FIGS. 6A-6B, the thickness removal process is referred to as a differential ion milling process which removes material from the mass load layer 381 but could have also been used to remove material from the second top electrode 332. Thus, the differential ion mill can adjust either the first or the second resonant frequency $f_{01}, f_{02}$ of the first or the second resonator 111,121 respectively, as well as the first or the second frequency temperature coefficients $T_{C1}, T_{C2}$ of the first or the second resonators 111,121 respectively. In so doing, the differential ion mill adjusts both the resultant beat frequency $f_B$ of the oscillatory circuit 100 and the final temperature drift (the circuit frequency temperature coefficient $T_{CC}$) of the beat frequency $f_B$. Thus, the differential ion mill can be used to target either the beat frequency $f_B$ of the oscillatory circuit 100 or the final temperature drift (the circuit frequency temperature coefficient $T_{CC}$) of the beat frequency $f_B$ but not both. The differential ion milling process could also be used to remove a portion of the thickness of first piezoelectric layer 351 while maintaining the thickness of the second piezoelectric layer 352, to remove a portion of the thickness of second piezoelectric layer 352 while maintaining the thickness of the first piezoelectric layer 351, to remove a portion of the thickness of the first top electrode 331 while maintaining the thickness of the second top electrode 332, to remove a portion of the thickness of the second top electrode 332 while maintaining the thickness of the first top electrode 331, to remove a portion of the thickness of the mass load layer 381 while maintaining the thickness of the second top electrode 332, or to remove a portion of the thickness of the second top electrode 332 while maintaining the thickness of the mass load layer 381.

From FIGS. 6A-6B, it can be observed that it is possible to do a differential ion mill to target either the final beat frequency $f_B$ or the final circuit frequency temperature coefficient $T_{CC}$ either before or after the targeting of the blanket ion mill process. As such, by combining these two processes (blanket ion mill and differential ion mill), it is possible to target both a desired beat frequency $f_B$ and a circuit frequency temperature coefficient $T_{CC}$ (i.e., the frequency temperature coefficient of the beat frequency $f_B$).

In a representative example, a beat frequency $f_B$ can be created at 165 MHz and approximately 0 ppm/C circuit frequency temperature coefficient $T_{CC}$ using 500 A of molybdenum in the center of the first piezoelectric structure 341. Representative values for the resonator structure 300 are as follows: (1) first bottom electrode 321, second bottom electrode 322, first top electrode 331, and second top electrode 332 at 1500 angstroms of molybdenum each, (2) first bottom piezoelectric layer 351, second bottom piezoelectric layer 352, first top piezoelectric layer 371, and second top piezoelectric layer 372 at 1.1 micron of aluminum nitride each, and (3) for the interstitial layer 361 and for the mass load layer 381 at 1,000 angstroms of molybdenum each.

Figure 7:
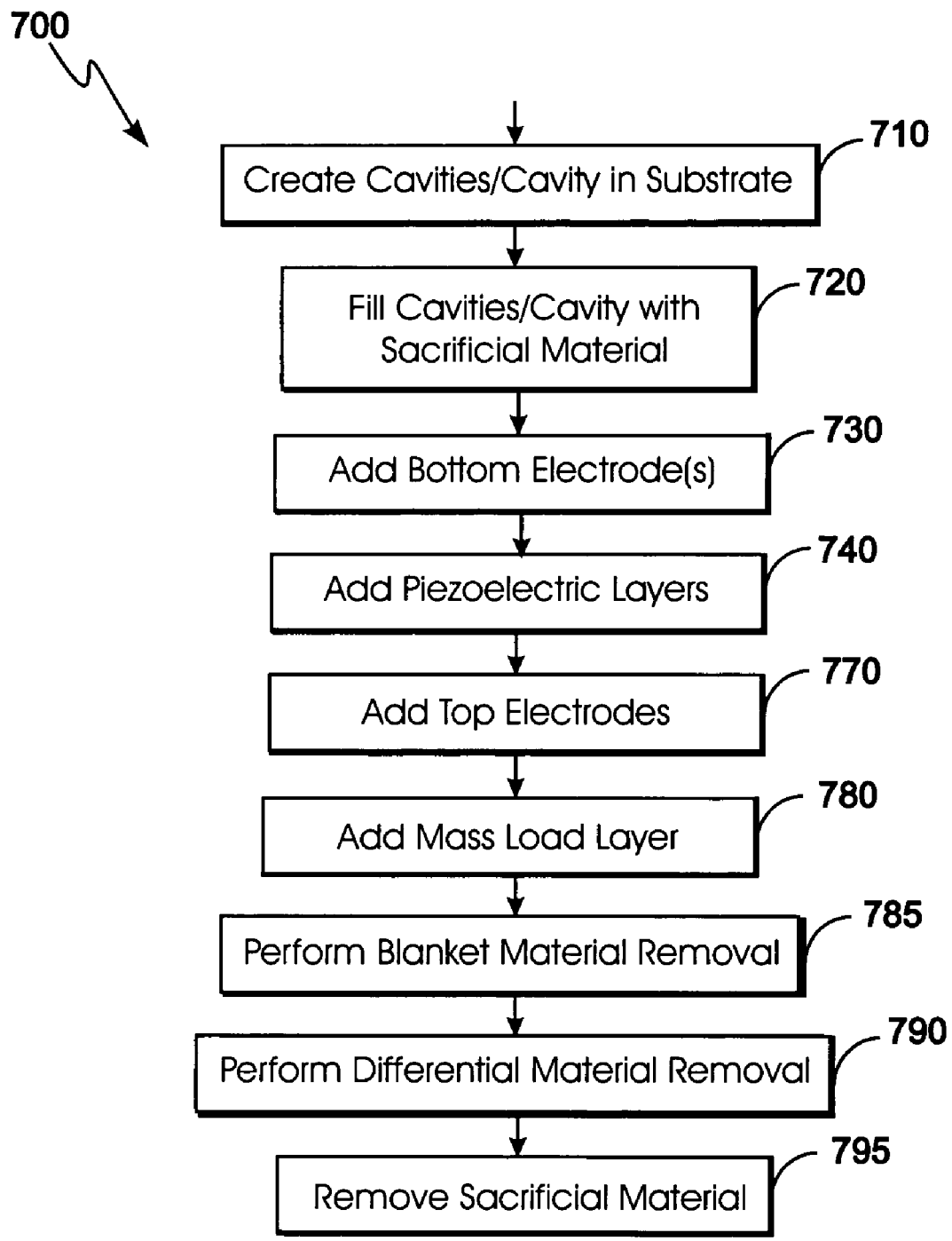
FIG. 7 is a flow chart of a method for fabricating the resonator structure of FIG. 3C.

FIG. 7 is a flow chart of a method 700 for fabricating the resonator structure 300 of FIG. 3C. With appropriate modification, this process can also be used to create a structure as in FIG. 3C but with only the single cavity 313 as shown in FIG. 3B. In block 710, the cavities 311,312 or the single cavity 313 are etched into the substrate 305. Block 710 then transfers control to block 720.

In block 720, the cavities 311,312 or the single cavity 313 are filled with a sacrificial material. The sacrificial material can be removed later and could be a phosphorous silica glass material. Block 720 then transfers control to block 730.

In block 730, the first and second bottom electrodes 321, 322 are fabricated. or a combined first bottom electrode 321 is fabricated. The first and second bottom electrodes 321,322 or the first bottom electrode 321 can be fabricated using well known technologies such as metal deposition and photolithography. As an example, a layer of molybdenum could be deposited onto a wafer followed by the spinning of photoresist onto the wafer, the photoresist could be exposed to appropriately pattern the photoresist, the photoresist could be subsequently developed, and then the molybdenum could be etched. Block 730 then transfers control to block 740.

In block 740, the first and second piezoelectric layers 351, 352 (which could be the same layer deposited at the same time and referred to herein collectively prior to patterning as the bottom wafer piezoelectric layer 350) are deposited above the first and second electrodes 321,322 or above the combined bottom electrode 321. Again, well known photolithography steps are used to define and create the first and second piezoelectric layers 351,352. As an example, a layer of aluminum nitride could be deposited onto a wafer followed by the spinning of photoresist onto the wafer, the photoresist could be exposed to appropriately pattern the photoresist, the photoresist could be subsequently developed, and then the aluminum nitride could be etched. Block 740 then transfers control to block 770.

In block 770, the first and second top electrodes 331,332 are fabricated. The first and second top electrodes 331,332 can be fabricated using well known technologies such as metal deposition and photolithography. As an example a layer of molybdenum could be deposited onto the first and second piezoelectric layers 351,352 followed by the spinning of photoresist onto the deposited molybdenum. The photoresist could be exposed to appropriately pattern the photoresist, the photoresist could be subsequently developed, and then the molybdenum could be etched to create the first and second top electrodes 331,332. Block 770 then transfers control to block 780.

In block 780, the mass load layer 381 is added on top of the first top electrode 331 of the first resonator 111. The mass load layer 381 can be fabricated using well known technologies such as deposition and photolithography. The temperature coefficient of the stiffness of the mass load layer 381 in this embodiment differs from that of the second top electrode 332. Various options exist for the mass load layer 381 as previously discussed. Should the mass load layer 381 be an organic material or a resin. The organic material or the resin could be deposited onto a wafer followed by the spinning of photoresist onto the wafer. The photoresist could be exposed to appropriately pattern the photoresist, the photoresist could be subsequently developed, and then the material could be etched to leave the mass load layer 381 over the first top electrode 331. Block 780 then transfers control to block 785.

In block 785, a portion of the thickness of the first top electrode 331 and a portion of the thickness of the second top electrode 332 are removed or a portion of the thickness of the second top electrode 332 and a portion of the thickness of the mass load layer 381 are removed. As appropriate the actions of block 785 can instead occur prior to the actions of block 780. Block 785 then transfers control to block 790.

In block 790, a portion of the thickness of first piezoelectric layer 351 is removed while maintaining the thickness of the second piezoelectric layer 352, a portion of the thickness of second piezoelectric layer 352 is removed while maintaining the thickness of the first piezoelectric layer 351, a portion of the thickness of the first top electrode 331 is removed while maintaining the thickness of the second top electrode 332, a portion of the thickness of the second top electrode 332 is removed while maintaining the thickness of the first top electrode 331, a portion of the thickness of the mass load layer 381 is removed while maintaining the thickness of the second top electrode 332, or a portion of the thickness the second top electrode 332 is removed while maintaining the thickness of the mass load layer 381. As appropriate the actions of block 790 can instead occur prior to the actions of block 770 or prior to the actions of block 780 or prior to the actions of block 785. Block 790 then transfers control to block 795.

In block 795, the sacrificial material previously deposed in the cavities 311,312 or single cavity 313 is removed. Should the sacrificial material be a glass, hydrofluoric acid can be used to etch it from the cavities 311,312 or the single cavity 313 as appropriate. Block 795 then terminates the process.

In an alternative embodiment of the above method, the mass load layer 381 is added on top of the first piezoelectric layer 351 of the first resonator 111 prior to the step adding the first and the second top electrodes 331,332. In other words, the order of blocks 770 and 780 is reversed.

Figure 8:
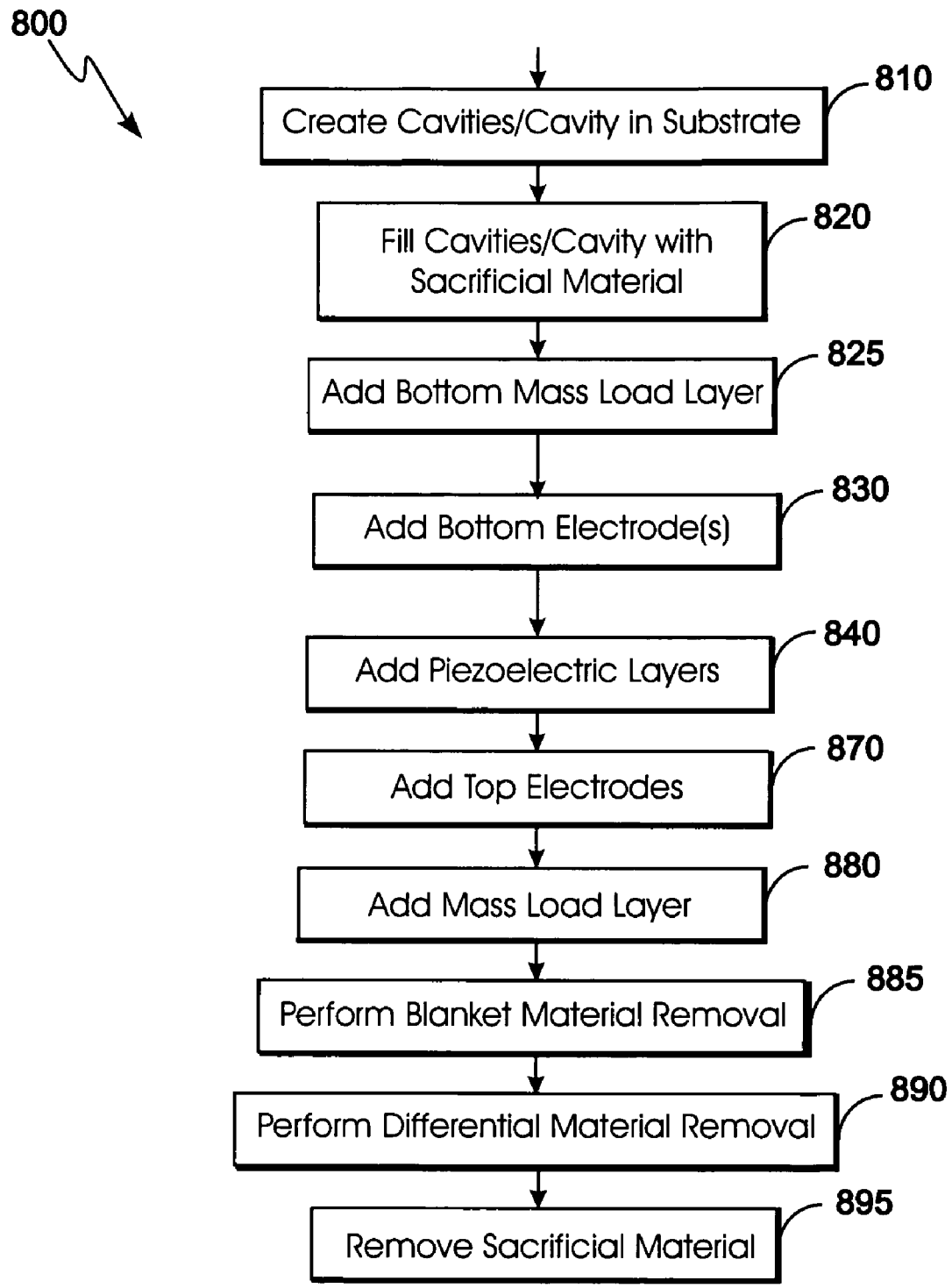
FIG. 8 is a flow chart of a method for fabricating the resonator structure of FIG. 3D.

FIG. 8 is a flow chart of a method 800 for fabricating the resonator structure 300 of FIG. 3D. With appropriate modification, this process can also be used to create a structure as in FIG. 3D but with only the single cavity 313 as shown in FIG. 3B. In block 810, the cavities 311,312 or the single cavity 313 are etched into the substrate 305. Block 810 then transfers control to block 820.

In block 820, the cavities 311,312 or the single cavity 313 are filled with a sacrificial material. The sacrificial material can be removed later and could be a phosphorous silica glass material. Block 820 then transfers control to block 825.

In block 825, the bottom mass load layer 382, is fabricated. The bottom mass load layer 382 can be fabricated using well known technologies such as deposition and photolithography. The temperature coefficient of the stiffness of the bottom mass load layer 382 in this embodiment differs from that of the second bottom electrode 322 or the combined bottom electrode 321 in the case of a single cavity 313. Various options exist for the bottom mass load layer 382 as previously discussed. Should the bottom mass load layer 382 be an organic material or a resin. The organic material or the resin could be deposited onto a wafer followed by the spinning of photoresist onto the wafer. The photoresist could be exposed to appropriately pattern the photoresist, the photoresist could be subsequently developed, and then the material could be etched to leave the bottom mass load layer 382 over the first top electrode 331. Block 825 then transfers control to block 830.

In block 830, the first and second bottom electrodes 321, 322 are fabricated. or a combined first bottom electrode 321 is fabricated. The first and second bottom electrodes 321,322 or the first bottom electrode 321 can be fabricated using well known technologies such as metal deposition and photolithography. As an example, a layer of molybdenum could be deposited onto a wafer followed by the spinning of photoresist onto the wafer, the photoresist could be exposed to appropriately pattern the photoresist, the photoresist could be subsequently developed, and then the molybdenum could be etched. Block 830 then transfers control to block 840.

In block 840, the first and second piezoelectric layers 351, 352 (which could be the same layer deposited at the same time and referred to herein collectively prior to patterning as the bottom wafer piezoelectric layer 350) are deposited above the first and second electrodes 321,322 or the combined bottom electrode 321. Again, well known photolithography steps are used to define and create the first and second piezoelectric layers 351,352. As an example, a layer of aluminum nitride could be deposited onto a wafer followed by the spinning of photoresist onto the wafer, the photoresist could be exposed to appropriately pattern the photoresist, the photoresist could be subsequently developed, and then the aluminum nitride could be etched. Block 840 then transfers control to block 870.

In block 870, the first and second top electrodes 331,332 are fabricated. The first and second top electrodes 331,332 can be fabricated using well known technologies such as metal deposition and photolithography. As an example a layer of molybdenum could be deposited onto the first and second piezoelectric layers 351,352 followed by the spinning of photoresist onto the deposited molybdenum. The photoresist could be exposed to appropriately pattern the photoresist, the photoresist could be subsequently developed, and then the molybdenum could be etched to create the first and second top electrodes 331,332. Block 870 then transfers control to block 880.

In block 880, the mass load layer 381 is added on top of the first top electrode 331 of the first resonator 111. The mass load layer 381 can be fabricated using well known technologies such as deposition and photolithography. Molybdenum, for example, could be deposited onto a wafer followed by the spinning of photoresist onto the wafer. The photoresist could be exposed to appropriately pattern the photoresist, the photoresist could be subsequently developed, and then the molybdenum could be etched to leave the mass load layer 381 over the first top electrode 331. Block 880 then transfers control to block 885.

In block 885, a portion of the thickness of the first top electrode 331 and a portion of the thickness of the second top electrode 332 are removed or a portion of the thickness of the second top electrode 332 and a portion of the thickness of the mass load layer 381 are removed. As appropriate the actions of block 885 can instead occur prior to the actions of block 880. Block 885 then transfers control to block 890.

In block 890, a portion of the thickness of first piezoelectric layer 351 is removed while maintaining the thickness of the second piezoelectric layer 352, a portion of the thickness of second piezoelectric layer 352 is removed while maintaining the thickness of the first piezoelectric layer 351, a portion of the thickness of the first top electrode 331 is removed while maintaining the thickness of the second top electrode 332, a portion of the thickness of the second top electrode 332 is removed while maintaining the thickness of the first top electrode 331, a portion of the thickness of the mass load layer 381 is removed while maintaining the thickness of the second top electrode 332, or a portion of the thickness the second top electrode 332 is removed while maintaining the thickness of the mass load layer 381. As appropriate the actions of block 890 can instead occur prior to the actions of block 870 or prior to the actions of block 880 or prior to the actions of block 885. Block 890 then transfers control to block 895.

In block 895, the sacrificial material previously deposited in the cavities 311,312 or single cavity 313 is removed. Should the sacrificial material be a glass, hydrofluoric acid can be used to etch it from the cavities 311,312 or the single cavity 313 as appropriate. Block 895 then terminates the process.

In an alternative embodiment of the above method, the bottom mass load layer 382 is added below the first piezoelectric layer 351 of the first resonator 111 after to the step adding the first and the second top electrodes 331,332. In other words, the order of blocks 825 and 830 is reversed.

Figure 9:
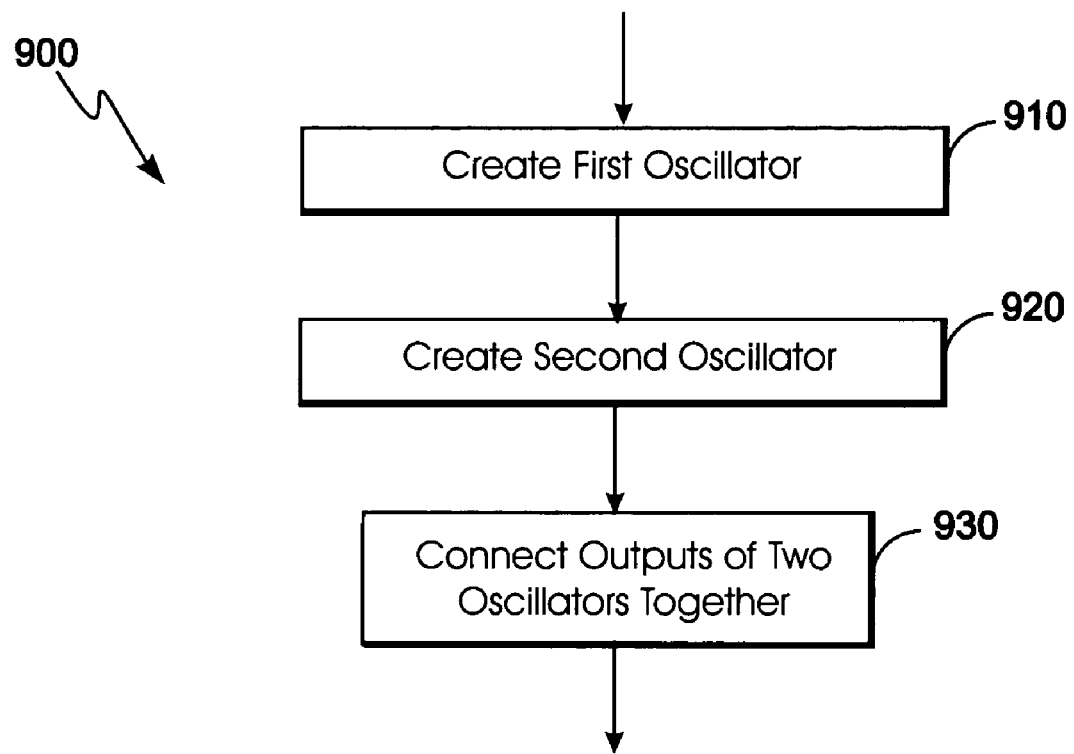
FIG. 9 is a flow chart of a method for fabricating part of the oscillatory circuit of FIG. 1.

FIG. 9 is a flow chart of a method 900 for fabricating part of the oscillatory circuit 100 of FIG. 1. In block 910, a first oscillator 110 configured to generate a first oscillating signal 115 at a first frequency $f_{o1}$ and having a first frequency temperature coefficient $T_{C1}$ is fabricated. Block 910 then transfers control to block 920.

In block 920, a second oscillator 120 configured to generate a second oscillating signal 125 at a second frequency $f_{o2}$ and having a second frequency temperature coefficient $T_{C2}$, wherein the second frequency $f_{o2}$ is greater than the first frequency $f_{o1}$, wherein the second frequency temperature coefficient $T_{C2}$ is less than the first frequency temperature coefficient $T_{C1}$, and wherein the difference between the second frequency $f_{o2}$ multiplied by the second frequency temperature coefficient $T_{C2}$ and the first frequency $f_{o1}$ multiplied by the first frequency temperature coefficient $T_{C1}$ is equal to zero is fabricated. Block 920 then transfers control to block 930.

In block 930, the outputs of the first and the second oscillators 110,120 are connected together. Block 930 then terminates the process.

Various materials other than aluminum nitride can be used for the piezoelectric material in the first bottom piezoelectric layer 351 and in the second bottom piezoelectric layer 352. Also, materials other than molybdenum can be used for the bottom electrodes 321,322, for the interstitial layer 361, and for the top electrodes 331,332. In addition, various other structures are also possible.

In representative embodiments, oscillator circuits 110,120 using paired resonators 111,121 whose resonant frequencies $f_{o1},f_{o2}$ and frequency drift characteristics $T_{C1},T_{C2}$ can be appropriately adjusted to result in oscillatory circuits 100 having very small frequency drift vs. temperature characteristics ($T_C$). Appropriate paired resonators 111,121 can be fabricated using integrated circuit techniques with resultant advantages in cost and size over quartz crystals which have been used in the past to obtain comparable frequency drift characteristics. In addition, individual resonators can also be constructed with targeted resonant frequency and frequency temperature coefficient.

In representative embodiments, two resonators 111,121 that drift with temperature at different rates are used in oscillator circuits 110,120 to create a beat frequency $f_B$ whose net temperature drift $T_{CC}$ is very small, if not zero, over the full temperature range standard for cell phones, laptop computers, and other comparable devices. The resonators can be fabricated as thin film bulk acoustic resonators (FBARS) and combined with other integrated circuitry to result in a silicon chip that could be approximately 0.2 millimeters (mm) thick and less than 1×1 mm² in area. In addition, the output signal can be relatively free of spurious modes and can be at a much higher frequency than that of a quartz resonator. As a result, less power is consumed in making the needed "clean" high frequency tones.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A temperature compensated pair of resonators, comprising:
a first resonator comprising: a first bottom electrode; a first piezoelectric structure comprising a first piezoelectric layer, a second piezoelectric layer and an interstitial layer disposed between, and in contact with both the first piezoelectric layer and the second piezoelectric layer, wherein the interstitial layer comprises a stiffness coefficient versus temperature that is greater than a stiffness coefficient versus temperature of either of the first piezoelectric layer or the second piezoelectric layer; a mass load layer disposed beneath the first bottom electrode; and a first top electrode, wherein the first resonator has a first resonant frequency; and
a second resonator comprising a second bottom electrode; a second piezoelectric structure; and a second top electrode, wherein the second resonator has a second resonant frequency and a temperature coefficient of the stiffness of the mass load layer differs from a temperature coefficient of stiffness of the second top electrode.

2. The temperature compensated pair of resonators as recited in claim 1, wherein the mass load layer is an organic material.

3. The temperature compensated pair of resonators as recited in claim 2, wherein the organic material is selected from the group consisting of PMMA (Polymethyl-methacrylate), PY (Polyimides), and BCB (Benzocyclobutene).

4. The temperature compensated pair of resonators as recited in claim 1, wherein the mass load layer is a resin.

5. The temperature compensated pair of resonators as recited in claim 4, wherein the resin is a low-k material.

6. The temperature compensated pair of resonators as recited in claim 1, wherein the mass load layer is an oxide.

7. A temperature compensated pair of resonators, comprising:
   a first resonator comprising: a first bottom electrode; a first piezoelectric structure comprising a first piezoelectric layer, a second piezoelectric layer and an interstitial layer disposed between, and in contact with both the first piezoelectric layer and the second piezoelectric layer, wherein the interstitial layer comprises a stiffness coefficient versus temperature that is greater than a stiffness coefficient verse temperature of either of the first piezoelectric layer or the second piezoelectric layer; a mass load layer disposed beneath the first bottom electrode; a first top electrode; and another mass load layer disposed over the first top electrode, wherein the first resonator has a first resonant frequency; and
   a second resonator comprising: a second bottom electrode; a second piezoelectric structure; and a second top electrode, wherein the second resonator has a second resonant frequency and a temperature coefficient of the stiffness of the mass load layer disposed beneath the first bottom electrode differs from a temperature coefficient of stiffness of the second bottom electrode.

8. The temperature compensated pair of resonators as recited in claim 7, wherein the mass load layer is an organic material.

9. The temperature compensated pair of resonators as recited in claim 8, wherein the organic material is selected from the group consisting of PMMA (Polymethyl-methacrylate), PY (Polyimides), and BCB (Benzocyclobutene).

10. The temperature compensated pair of resonators as recited in claim 7, wherein the mass load layer is a resin.

11. The temperature compensated pair of resonators as recited in claim 10, wherein the resin is a low-k material.

12. The temperature compensated pair of resonators as recited in claim 7, wherein the mass load layer is an oxide.

* * * * *